US012795900B2

(12) United States Patent
Lee et al.

(10) Patent No.: US 12,795,900 B2

(45) Date of Patent: Nov. 10, 2026

(54) METHOD OF FABRICATING SEMICONDUCTOR MEMORY DEVICE

(71) Applicant: Samsung Electronics Co., Ltd., Suwon-si (KR)

(72) Inventors: Chanmi Lee, Suwon-si (KR); Yuna Lee, Hwaseong-si (KR); Sangwuk Park, Hwaseong-si (KR); Jungpyo Hong, Gwangmyeong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 946 days.

(21) Appl. No.: 17/984,376

(22) Filed: Nov. 10, 2022

(65) Prior Publication Data

US 2023/0217649 A1 Jul. 6, 2023

(30) Foreign Application Priority Data

Jan. 3, 2022 (KR) ........................ 10-2022-0000336

(51) Int. Cl.
*H10B 12/00* (2023.01)

(52) U.S. Cl.
CPC ......... *H10B 12/485* (2023.02); *H10B 12/053* (2023.02); *H10B 12/315* (2023.02); *H10B 12/34* (2023.02); *H10B 12/482* (2023.02)

(58) Field of Classification Search
CPC .............. H10B 12/0335; H10B 12/053; H10B 12/315; H10B 12/34; H10B 12/482; H10B 12/485
See application file for complete search history.

(56) References Cited

U.S. PATENT DOCUMENTS

| | | | |
|---|---|---|---|
| 7,078,292 B2 | 7/2006 | Park et al. |
| 9,012,321 B1 | 4/2015 | Kim et al. |

(Continued)

FOREIGN PATENT DOCUMENTS

| | | | |
|---|---|---|---|
| KR | 100825814 B1 | 4/2008 |
| KR | 100843716 B1 | 7/2008 |

(Continued)

*Primary Examiner* — Meiya Li

(74) *Attorney, Agent, or Firm* — Muir Patent Law, PLLC

(57) ABSTRACT

A semiconductor memory device may be formed by a method of fabricating the same. The method may include forming a buffer insulating layer on a semiconductor substrate including active portions, forming bit line structures on the buffer insulating layer, forming bit line spacers on side surfaces of each of the bit line structures, patterning the buffer insulating layer to form gap regions extending in a first direction, the gap regions formed between the bit line structures and exposing portions of the active portions, forming a protection oxide layer to cover the portions of the active portions exposed through the gap regions, forming a mold layer to fill the gap regions, in which the protection oxide layer is formed, forming mold patterns respectively in each of the gap regions to be spaced apart from each other, forming fence patterns in each of the gap regions and between the mold patterns, removing the mold patterns to form contact regions exposing the protection oxide layer, removing the protection oxide layer, and forming buried contact patterns in the contact regions to contact the portions of the active portions.

20 Claims, 38 Drawing Sheets

(56) References Cited

U.S. PATENT DOCUMENTS

| | | | | |
|---|---|---|---|---|
| 9,627,387 | B2 | 4/2017 | Jung et al. | |
| 9,754,946 | B1 | 9/2017 | Yang et al. | |
| 10,163,909 | B2 | 12/2018 | Wang et al. | |
| 10,461,153 | B2 | 10/2019 | Lee et al. | |
| 10,522,362 | B2 | 12/2019 | Kim et al. | |
| 11,037,930 | B2 | 6/2021 | Park et al. | |
| 2008/0283957 | A1 | 11/2008 | Kang et al. | |
| 2017/0294439 | A1 | 10/2017 | Kim et al. | |
| 2019/0088658 | A1 | 3/2019 | Wang et al. | |
| 2019/0164975 | A1 | 5/2019 | Song et al. | |
| 2020/0194302 | A1 | 6/2020 | Ahn et al. | |
| 2021/0035983 | A1 | 2/2021 | Song et al. | |
| 2021/0036101 | A1 | 2/2021 | Choi et al. | |
| 2021/0193664 | A1 | 6/2021 | Seong et al. | |
| 2023/0164976 | A1* | 5/2023 | Park ..................... | H10B 12/033 257/30 |

FOREIGN PATENT DOCUMENTS

| | | | |
|---|---|---|---|
| KR | 1020160068067 | A | 6/2016 |
| KR | 1020190032718 | A | 3/2019 |
| KR | 1020200140645 | A | 12/2020 |
| KR | 1020210014018 | A | 2/2021 |
| TW | I238508 | B | 8/2005 |
| TW | I615921 | B | 2/2018 |

* cited by examiner

METHOD OF FABRICATING SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2022-0000336, filed on Jan. 3, 2022, in the Korean Intellectual Property Office, the entire contents of which are hereby incorporated by reference.

BACKGROUND

The present disclosure relates to a semiconductor device, a method of fabricating a semiconductor memory device including the same, and a semiconductor memory device fabricated thereby, and in particular, to a method of fabricating a semiconductor memory device with improved reliability and a semiconductor memory device fabricated thereby.

Due to their small-sized, multifunctional, and/or low-cost characteristics, semiconductor devices are being esteemed as important elements in the electronics industry. With the advancement of the electronic industry, there is an increasing demand for a semiconductor device with higher integration density. To increase the integration density of a semiconductor device, it is helpful to reduce line widths of patterns constituting the semiconductor device. However, novel and expensive exposure technologies are needed to reduce the line widths of the patterns, and thus, it becomes difficult to increase the integration density of the semiconductor device. Thus, a variety of new technologies are being recently studied to overcome the difficulty in increasing an integration density of semiconductor memory devices.

SUMMARY

An embodiment of the inventive concept provides a method of fabricating a semiconductor memory device with improved reliability and a semiconductor memory device fabricated thereby.

According to an embodiment of the inventive concept, a method of fabricating a semiconductor memory device may include forming a buffer insulating layer on a semiconductor substrate including active portions, forming bit line structures on the buffer insulating layer, forming bit line spacers on side surfaces of each of the bit line structures, patterning the buffer insulating layer to form gap regions extending in a first direction, the gap regions formed between the bit line structures and exposing portions of the active portions, forming a protection oxide layer to cover the portions of the active portions exposed through the gap regions, forming a mold layer to fill the gap regions, in which the protection oxide layer is formed, forming mold patterns respectively in each of the gap regions to be spaced apart from each other, forming fence patterns in each of the gap regions and between the mold patterns, removing the mold patterns to form contact regions exposing the protection oxide layer, removing the protection oxide layer, and forming buried contact patterns in the contact regions to contact the portions of the active portions.

According to an embodiment of the inventive concept, a method of fabricating a semiconductor memory device may include forming word line structures in a semiconductor substrate including active portions, the word line structures crossing the active portion and extending in a first direction, forming a buffer insulating layer to cover a top surface of the semiconductor substrate and top surfaces of the word line structures, forming bit line structures on the buffer insulating layer to extend in a second direction crossing the first direction, forming bit line spacers on side surfaces of each of the bit line structures, patterning the buffer insulating layer to form gap regions, which extend in the second direction and are disposed between the bit line structures to expose portions of the active portions, forming a protection oxide layer to cover the portions of the active portions exposed through the gap regions, forming a mold layer to fill the gap regions, patterning the mold layer using a mask pattern, which extends in the first direction, to form mold patterns spaced apart from each other in the second direction in the gap regions, oxidizing surfaces of the mold patterns to form a buffer oxide layer, removing the buffer oxide layer, forming fence patterns between the mold patterns, removing the mold patterns to form contact regions exposing the protection oxide layer, after the forming of the fence patterns, removing the protection oxide layer to expose the portions of the active portions, and forming buried contact patterns, which contact the portions of the active portions, in the contact regions.

According to an embodiment of the inventive concept, a semiconductor memory device may include a device isolation layer provided in a semiconductor substrate to define an active portion, word line structures, which are buried in the semiconductor substrate and extend in a first direction to cross the active portion, and each of which includes a word line, a gate capping pattern on the word line, and a gate insulating pattern between the semiconductor substrate and the word line, bit line structures extended in a second direction crossing the first direction to cross the word lines, bit line spacers disposed on side surfaces of each of the bit line structures, fence patterns disposed between adjacent ones of the bit line structures and on the word lines, and buried contact patterns disposed between the bit line structures, which are adjacent to each other in the first direction, and between the fence patterns, which are adjacent to each other in the second direction. Each of the buried contact patterns may have a bottom surface, which is flat and has a tetragonal shape.

DETAILED DESCRIPTION

Example embodiments of the inventive concepts will now be described more fully with reference to the accompanying drawings, in which example embodiments are shown.

Figure 1:
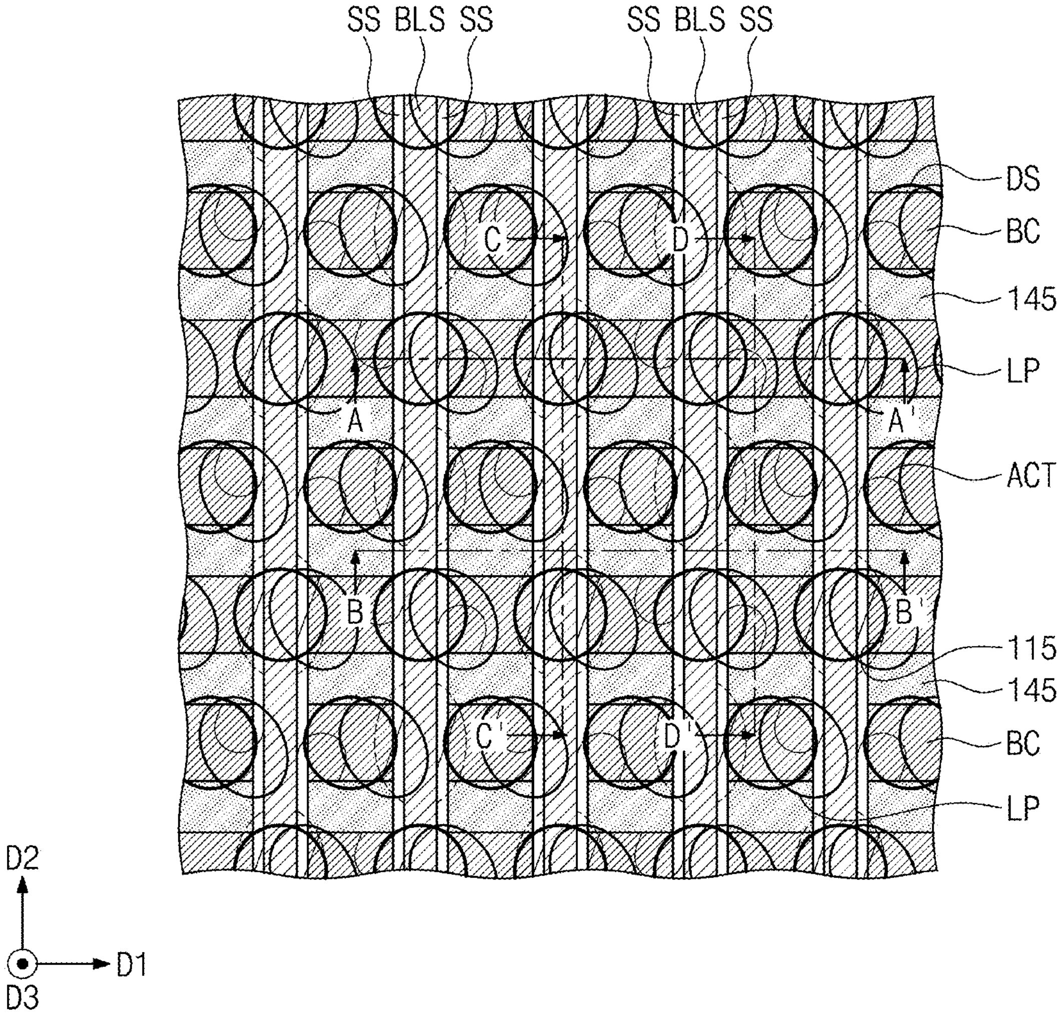
FIG. 1 is a plan view illustrating a semiconductor memory device according to an embodiment of the inventive concept.
Figure 2A:
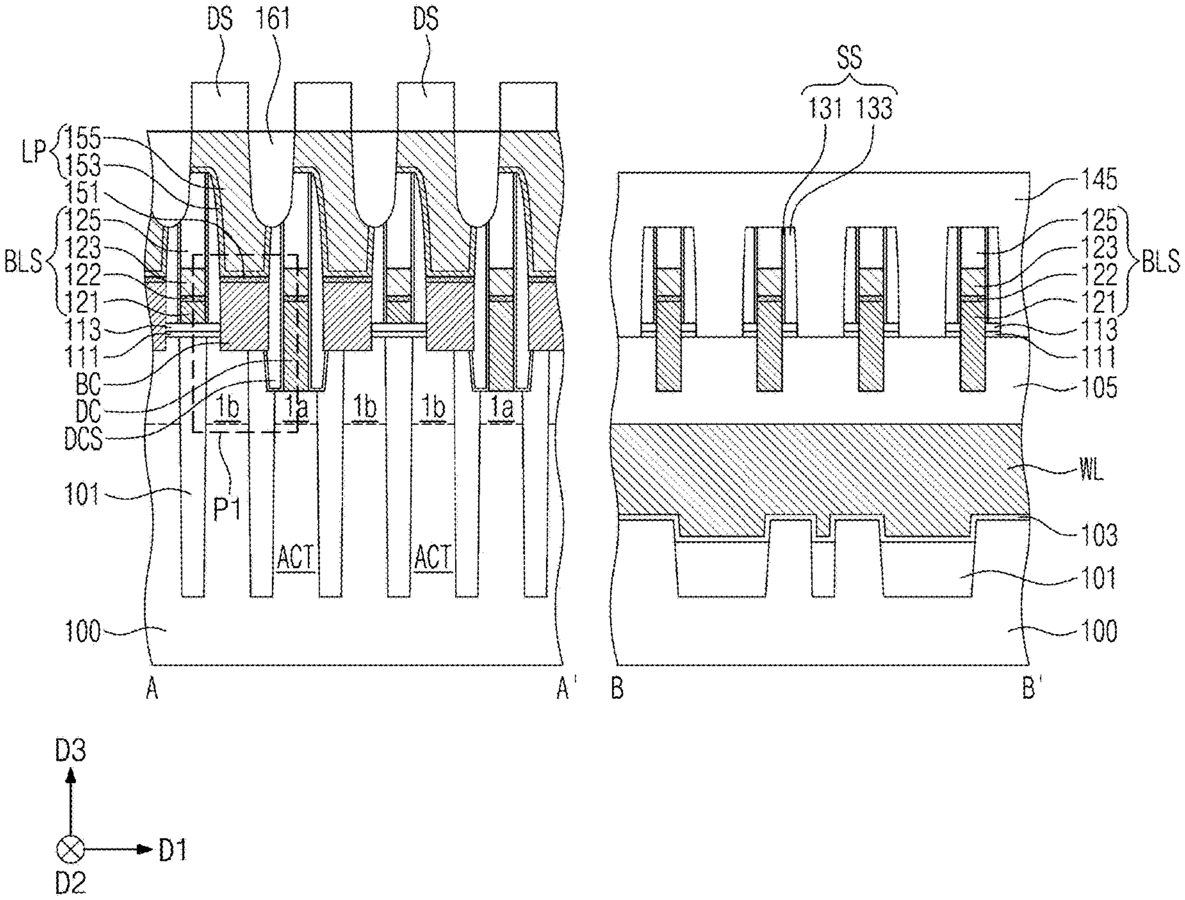
FIG. 2A is a sectional view taken along lines A-A' and B-B' of FIG. 1.
Figure 2B:
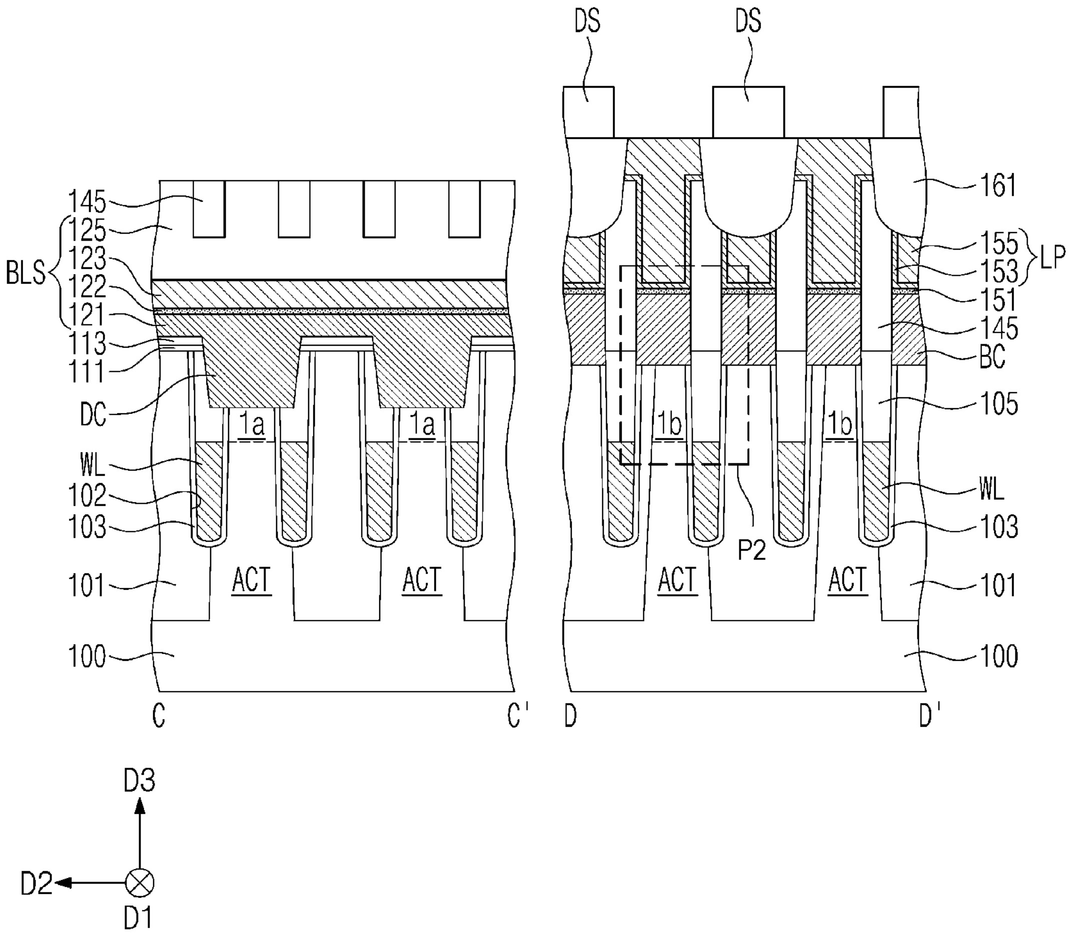
FIG. 2B is a sectional view taken along lines C-C' and D-D' of FIG. 1.
Figure 3A:
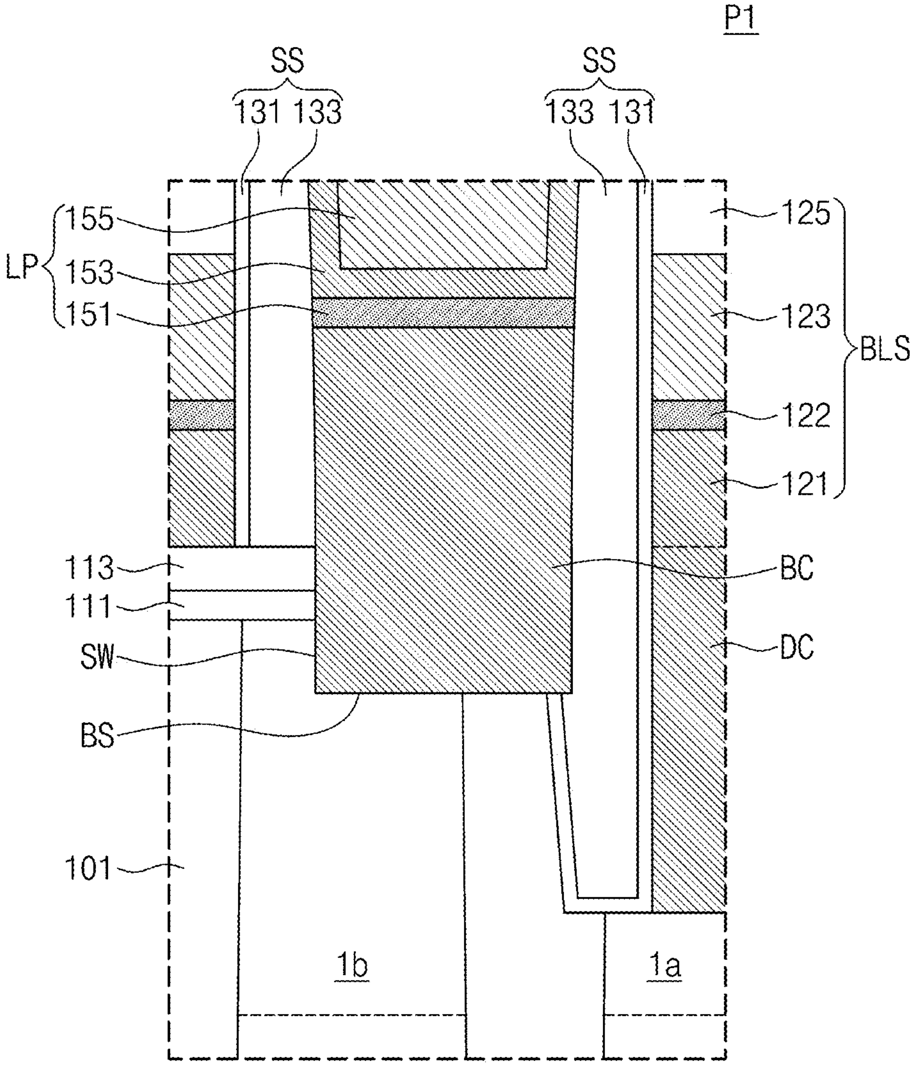
FIGS. 3A and 3B are enlarged sectional views illustrating a portion 'P1' of FIG. 2A.
Figure 3B:
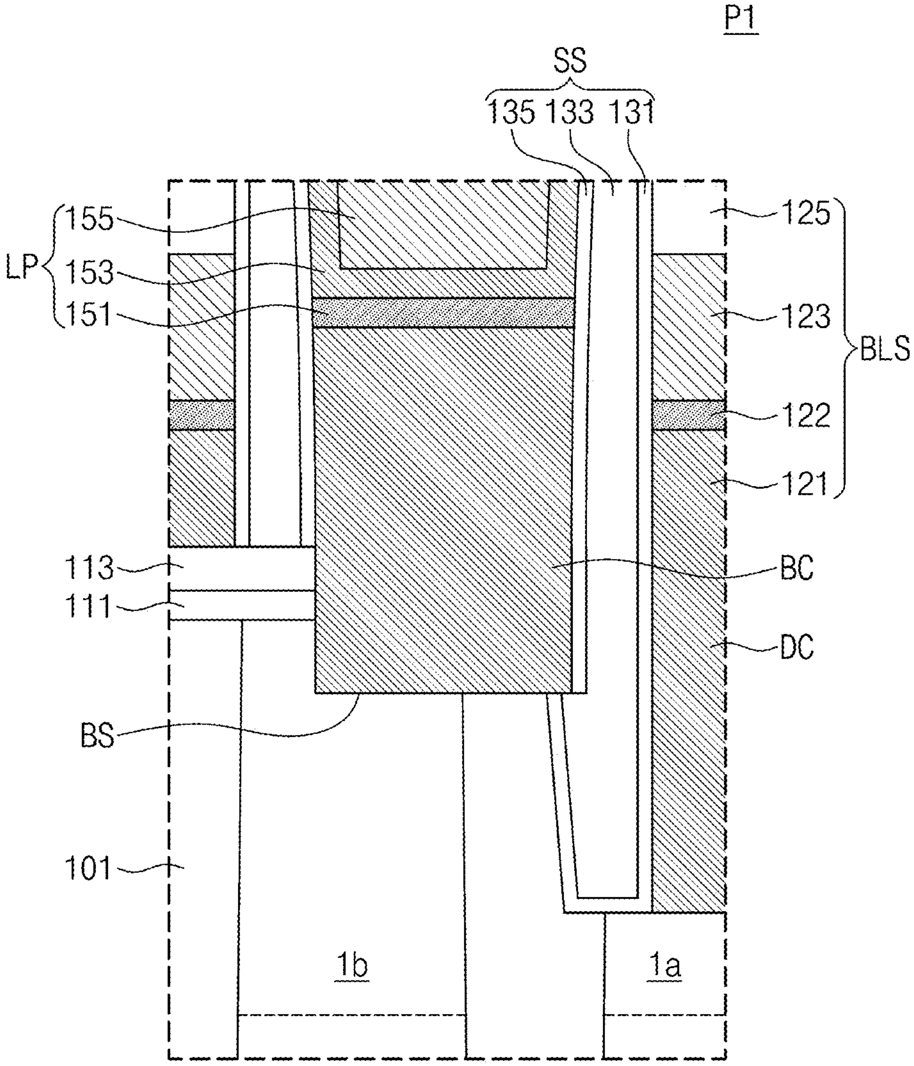
Figure 3C:
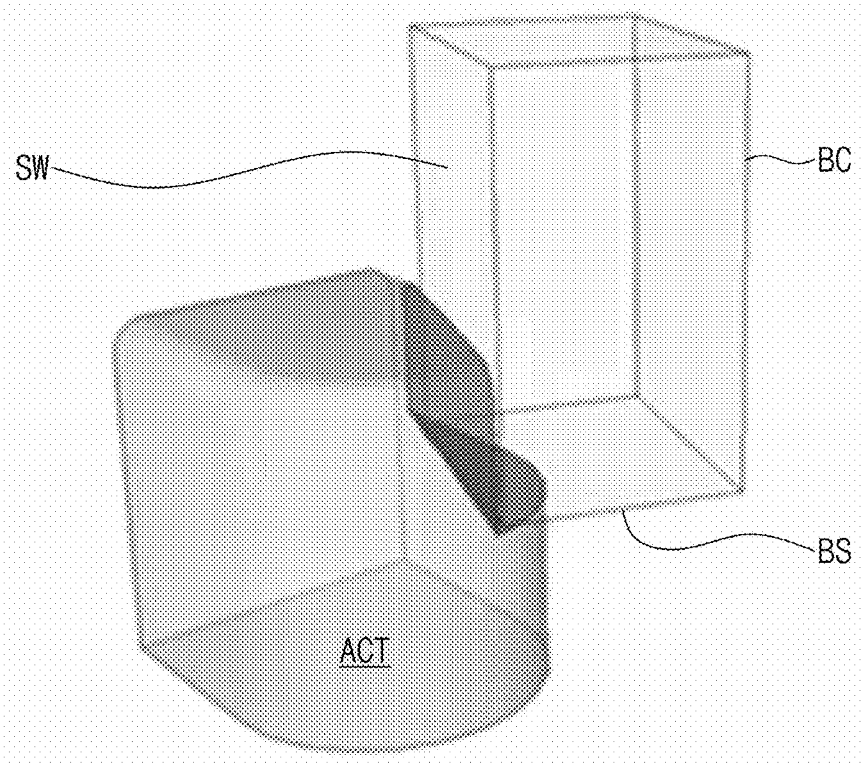
FIG. 3C is a perspective view illustrating a buried contact pattern.
Figure 4A:
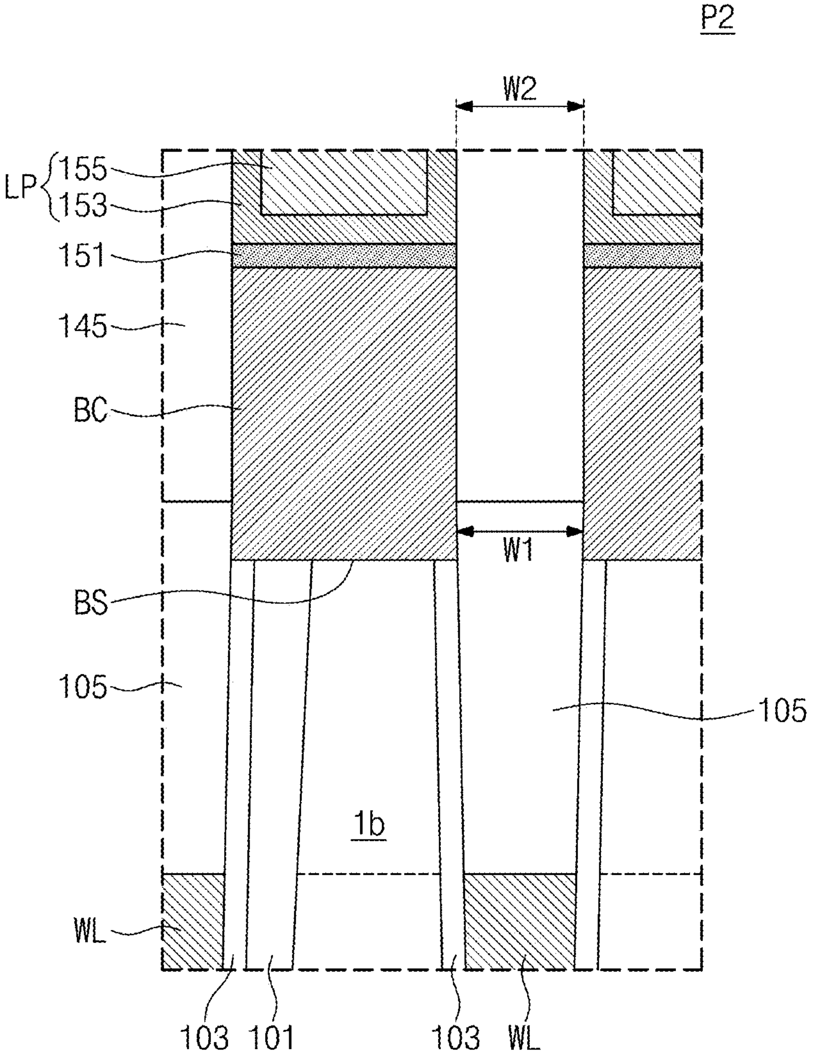
FIGS. 4A and 4B are enlarged sectional views illustrating a portion 'P2' of FIG. 2B.
Figure 4B:
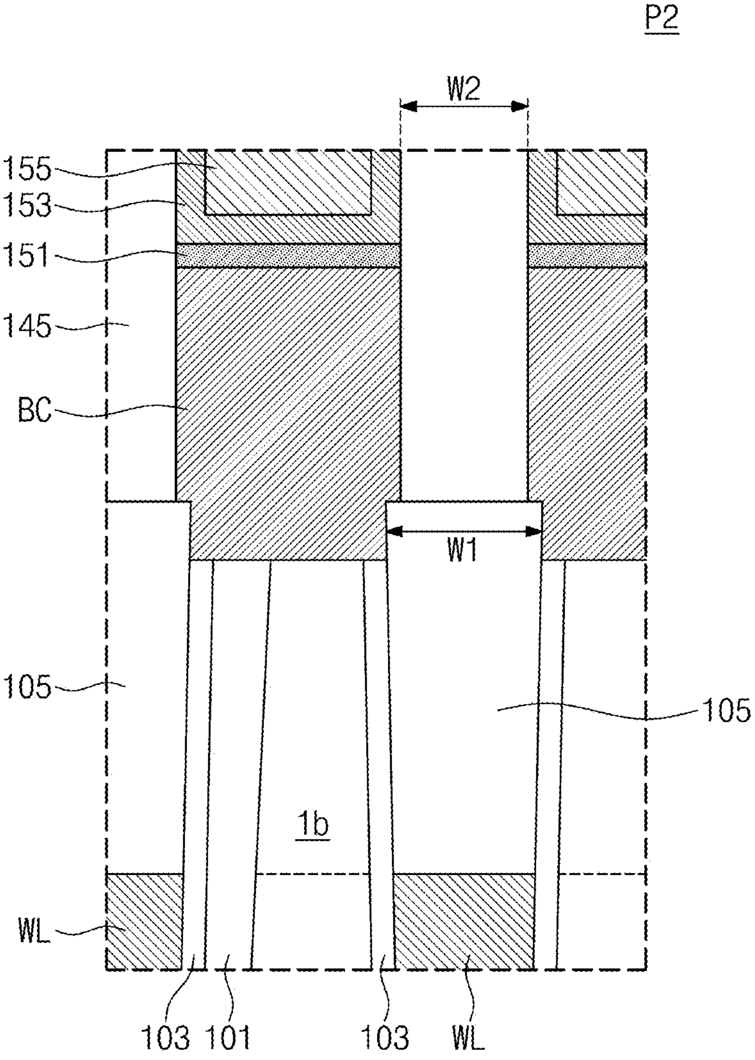

FIG. 1 is a plan view illustrating a semiconductor memory device according to an embodiment of the inventive concept. FIG. 2A is a sectional view taken along lines A-A' and B-B' of FIG. 1. FIG. 2B is a sectional view taken along lines C-C' and D-D' of FIG. 1. FIGS. 3A and 3B are enlarged sectional views illustrating a portion 'P1' of FIG. 2A, and FIG. 3C is a perspective view illustrating a buried contact pattern. FIGS. 4A and 4B are enlarged sectional views illustrating a portion 'P2' of FIG. 2B. The semiconductor memory device may refer to, for example, a semiconductor chip including an integrated circuit formed on a die from a semiconductor wafer, or a semiconductor package including one or more semiconductor memory chips.

Referring to FIGS. 1, 2A, and 2B, a device isolation layer 101 may be disposed in a semiconductor substrate 100 to define active portions ACT. In an embodiment, the semiconductor substrate 100 may be a silicon wafer, a germanium wafer, or a silicon-germanium wafer.

In an embodiment, when viewed in a plan view, the active portions ACT may have a rectangular or bar shape (e.g., an oval shape in some cases) and may be two-dimensionally arranged in a first direction D1 and a second direction D2, which are non-parallel (e.g., perpendicular) to each other. When viewed in a plan view, the active portions ACT may be arranged in a staggered manner and each active portion ACT may have a long axis that is inclined (e.g., at an angle) with respect to the first and second directions D1 and D2 (e.g., a diagonal direction).

Word line structures may be provided in the semiconductor substrate 100 and may extend in the first direction D1 to cross the active portions ACT. Each of the word line structures may include a word line WL, a gate insulating pattern 103 between the semiconductor substrate 100 and the word line WL, and a gate capping pattern 105 on the word line WL.

When viewed in a plan view, the word lines WL may be disposed in the semiconductor substrate 100 and may extend in the first direction D1 to cross the active portions ACT and the device isolation layer 101. Each of the active portion ACT may be provided to cross a pair of the word lines WL. Top surfaces of the word lines WL may be located at a vertical level (e.g., a height above a bottom surface of the semiconductor substrate 100) lower than a top surface of the semiconductor substrate 100. A height of a bottom surface of the word line WL (e.g., above a bottom surface of the semiconductor substrate 100) may vary depending on a material of an underlying element. As an example, the height of the bottom surface of the word line WL may be higher on the active portion ACT than on the device isolation layer 101. A top surface (e.g. top-most surface) of the gate capping pattern 105 may be substantially coplanar with the top surface (e.g., top-most surface) of the semiconductor substrate 100 and a top surface (e.g., top-most surface) of the device isolation layer 101. Terms such as "same," "equal," "planar," "coplanar," "parallel," and "perpendicular," as used herein encompass identicality or near identicality including variations that may occur, for example, due to manufacturing processes. The term "substantially" may be used herein to emphasize this meaning, unless the context or other statements indicate otherwise.

The word lines WL may be formed of or include at least one conductive material. The gate insulating pattern 103 may be formed of or include at least one of silicon oxide, silicon nitride, silicon oxynitride, or high-k dielectric materials. For example, the gate capping pattern 105 may include a silicon nitride layer or a silicon oxynitride layer.

First and second impurity regions 1*a* and 1*b* may be formed in portions of the active portions ACT located at opposite sides of each of the word lines WL. The first and second impurity regions 1*a* and 1*b* may have bottom surfaces that are located at a specific depth from the top surfaces of the active portions ACT (e.g., the first and second impurity regions 1*a* and 1*b* may extend to a specific depth from the top surfaces of the active portions ACT). The first impurity region 1*a* may be disposed in a portion of each of the active portions ACT between the word lines WL, and the second impurity regions 1*b* may be disposed in end portions of each of the active portions ACT, which are spaced apart from the first impurity region 1*a*. The first and second impurity regions 1*a* and 1*b* may be doped to have a conductivity type different from the semiconductor substrate 100.

A first buffer insulating layer 111 and a second buffer insulating layer 113 may be sequentially provided on the semiconductor substrate 100. As an example, the first buffer insulating layer 111 may be a silicon oxide layer, and the second buffer insulating layer 113 may be a silicon nitride layer. Alternatively, only one of the first and second buffer insulating layers 111 and 113 may be provided. Each of the first and second buffer insulating layers 111 and 113 may be an island-shaped or isolated pattern, when viewed in a plan view. In an embodiment, the first and second buffer insulating layers 111 and 113 may be provided to cover not only end portions of two adjacent ones of the active portions ACT but also a portion of the device isolation layer 101 therebetween.

In an embodiment, bit line structures BLS may be provided on the semiconductor substrate 100 and may extend in the second direction D2 to cross the word lines WL. Each of the bit line structures BLS may be placed on the first impurity regions 1*a*. In an embodiment, each of the bit line structures BLS may include a polysilicon pattern 121, a silicide pattern 122, a metal pattern 123, and a hard mask pattern 125, which are sequentially stacked. The first and second buffer insulating layers 111 and 113 may be interposed between the polysilicon pattern 121 and the semiconductor substrate 100, and a portion of the polysilicon pattern 121 (hereinafter, a bit line contact pattern DC) may be in contact with the first impurity region 1*a*. The silicide pattern 122 may be formed of or include at least one of titanium silicide, cobalt silicide, or nickel silicide. The metal pattern 123 may be formed of or include at least one of conductive metal nitride materials (e.g., titanium nitride and tantalum nitride) or metallic materials (e.g., tungsten, titanium, and tantalum). The term "contact" as used herein refers to a direct connection (i.e., touching) unless the context indicates otherwise.

A bottom surface of the bit line contact pattern DC may be located at a level that is lower than the top surface of the semiconductor substrate 100 and is higher than the top surfaces of the word lines WL. In an embodiment, the bit line contact pattern DC may be locally formed in a recess region, which is formed in the semiconductor substrate 100 to expose the first impurity region 1*a*. The recess region 115 may have an elliptical shape, and the smallest width of the recess region 115 may be larger than a width of each of the bit line structures BLS in the first direction D1. The recess region 115 may have a width in the first direction D1 and a length in the second direction D2. The length of the recess region 115 may be greater than the width of the recess region 115.

In the bit line structures BLS, the hard mask pattern 125 may have a first thickness (e.g., in the vertical direction) between landing pads LP and may have a second thickness (e.g., in the vertical direction), which is smaller than the first thickness, between fence patterns 145. The hard mask pattern 125 may be formed of or include at least one insulating material (e.g., silicon nitride).

A bit line contact spacer DCS may be provided to fill a remaining space of the recess region, in which the bit line contact pattern DC is formed. In an embodiment, the bit line contact spacer DCS may be provided to cover opposite side surfaces of the bit line contact pattern DC. Alternatively, the bit line contact spacer DCS may be provided in the recess region to surround the bit line contact pattern DC. The bit line contact spacer DCS may be formed of or include an insulating material having an etch selectivity with respect to an interlayer insulating layer. For example, the bit line contact spacer DCS may be formed of or include at least one of silicon oxide, silicon nitride, and/or silicon oxynitride and may have a multi-layered structure. In an embodiment, a top surface of the bit line contact spacer DCS may be located at substantially the same level as a top surface of the interlayer insulating layer.

In an embodiment, bit line spacers SS may be disposed on opposite side surfaces of the bit line structures BLS. The bit line spacers SS may extend along the side surfaces of the bit line structures BLS or in the second direction D2. The bit line spacers SS may be disposed between the side surfaces of the bit line structures BLS and a buried contact pattern BC and between the side surfaces of the bit line structures BLS and the fence pattern 145.

As an example, referring to FIG. 3A, the bit line spacers SS may include first and second spacers 131 and 133, which are sequentially formed on the side surfaces of the bit line structures BLS. The first and second spacers 131 and 133 may be formed of or include two different insulating materials having an etch selectivity with respect to each other. For example, the first spacer 131 may be formed of or include silicon oxide, and the second spacer 133 may be formed of or include silicon nitride.

As another example, referring to FIG. 3B, the bit line spacers SS may include first, second, and third spacers 131, 133, and 135, which are sequentially formed on the side surfaces of the bit line structures BLS. Here, the second spacer 133 may be formed of or include an insulating material having an etch selectivity with respect to the first and third spacers 131 and 135. For example, the first and third spacers 131 and 135 may be formed of or include silicon nitride, and the second spacer 133 may be formed of or include silicon oxide. Alternatively, the second spacer 133 may be an air gap, which is an empty space between the first and third spacers 131 and 135 filled with gas rather than a solid (e.g., filled with air or other gases present during the manufacturing process).

In an embodiment, the buried contact patterns BC may be disposed between an adjacent pair of the bit line structures BLS. The buried contact patterns BC may be formed of or include at least one of doped polysilicon or metallic materials. The buried contact patterns BC may contact the second impurity regions 1*b*, respectively. The buried contact patterns BC may be respectively disposed between the word lines WL and between the bit line structures BLS, when viewed in a plan view.

The buried contact patterns BC may be two-dimensionally spaced apart from each other, as shown in FIG. 1. As an example, the buried contact patterns BC, which are arranged in the first direction D1, may be spaced apart from each other with the bit line structures BLS interposed therebetween. The buried contact patterns BC, which are arranged in the second direction D2, may be spaced apart from each other with the fence patterns 145 interposed therebetween. The buried contact patterns BC may be provided to fill spaces that are defined by the bit line structures BLS, which are adjacent to each other in the first direction D1, and the fence patterns 145, which are adjacent to each other in the second direction D2. Top surfaces of the buried contact patterns BC may be located at a level that is lower than top surfaces of the fence patterns 145 and top surfaces of the bit line structures BLS. The top surfaces of the buried contact patterns BC may be located at a level that is lower than a top surface of the metal pattern 123 of the bit line structure BLS.

Bottom surfaces of the buried contact patterns BC may be located at a level that is lower than the top surface of the semiconductor substrate 100 and is higher than the bottom surface of the bit line contact pattern DC. In addition, the buried contact patterns BC may be electrically disconnected from (e.g., isolated from) the bit line contact pattern DC by the bit line contact spacer DCS. Each of the buried contact patterns BC may have first side surfaces, which contact the bit line spacers SS, and second side surfaces, which contact the fence patterns 145. Each buried contact pattern BC may be formed of a single, continuous, integrated structure, formed for example homogenously of a single material, without any grain boundaries therein.

In an embodiment, as shown in FIGS. 3A and 3C, each of the buried contact patterns BC may have a bottom surface BS, which is substantially flat, and side surfaces SW, which are substantially perpendicular to the bottom surface BS. The bottom surface BS of each of the buried contact patterns BC may have a substantially tetragonal shape. For example, each of the buried contact patterns BC may have a substantially rectangular parallelepiped shape. Both a bottom surface and a side surface of each buried contact pattern BC may contact a respective active portion ACT (e.g., 1*b*). For example, each buried contact pattern BC may contact a top surface and a side surface of a respective active portion ACT. In this case, a contact area between the buried contact pattern BC and the active portion ACT may be increased. For example, the bottom surface BS of each of the buried contact patterns BC and one of the side surfaces SW of each of the buried contact patterns BC may be in contact with a portion of the active portion ACT.

A width of each of the buried contact patterns BC in the first direction D1 may be equal to or smaller than a distance between the bit line spacers SS between adjacent ones of the bit line structures BLS. In one embodiment, the buried contact patterns BC do not vertically overlap the bit line spacers SS (e.g., do not overlap from a plan view).

Referring to FIGS. 4A and 4B, a lower portion of each of the buried contact patterns BC may be disposed between upper portions of the gate capping patterns 105, which are adjacent to each other in the second direction D2. The lower portion of each of the buried contact patterns BC may contact side surfaces of the gate capping patterns 105. For example, the lower portion of each of the buried contact patterns BC may be self-aligned to the gate capping patterns 105. A width, in the second direction D2, of the lower portion of each of the buried contact patterns BC may correspond to a distance between adjacent ones of the gate capping patterns 105.

In an embodiment, the fence patterns 145 may be disposed between the bit line structures BLS to be spaced apart from each other in the second direction D2. The fence patterns 145 may be disposed between the buried contact patterns BC, which are adjacent to each other in the second direction D2. The fence patterns 145 may overlap the word lines WL, when viewed in a plan view, and may be disposed on the gate capping pattern 105. The fence patterns 145 may have top surfaces that are located at substantially the same level as the top surfaces of the bit line structures BLS. The fence patterns 145 may be formed of or include at least one insulating material (e.g., silicon nitride).

Referring to FIGS. 4A and 4B, a width W2 of the fence pattern 145 may be substantially equal to or less than a width W1 of the gate capping pattern 105, when measured in the second direction D2.

The landing pads LP may be disposed on the buried contact patterns BC, respectively. The landing pads LP may be electrically connected to the buried contact patterns BC, respectively.

In an embodiment, the landing pad LP may include a lower portion, which is provided to fill a space between the bit line structures BLS and between the fence patterns 145, and an upper portion, which extends from the lower portion to a region on the bit line structures BLS. The upper portion of the landing pad LP may overlap with a portion of the bit line structure BLS, when viewed in a plan view. Each of the upper portions of the landing pads LP may cover a top (e.g., top-most) surface of the hard mask pattern 125 of the bit line structure BLS and may have a width in the first direction D1 which is larger than that of the buried contact pattern BC. For example, an upper width of the landing pad LP may be larger than a distance between the bit line structures BLS or a width of the bit line structure BLS. In this case, since the upper portion of the landing pad LP extends to a region on the bit line structure BLS, the top surface of the landing pad LP may have an increased area.

The top surface (e.g., top-most surface) of the landing pad LP may be located at a level higher than the top surfaces of the bit line structures BLS, and the bottom surface (e.g., bottom-most surface) of the landing pad LP may be located at a level lower than the top surfaces of the bit line structures BLS. As an example, the bottom surface of the landing pad LP may be located at a level lower than the top surface of the metal pattern 123 of the bit line structure BLS.

In an embodiment, when viewed in a plan view, the upper portion of the landing pad LP may have an elliptical shape with long and short axes, and here, the long axis of the upper portion of the landing pad LP may be inclined with respect to both of the first and second directions D1 and D2 (e.g., the long axis may be diagonal to the first and second directions D1 and D2). In an embodiment, the upper portion of the landing pad LP may have a rounded diamond shape, a rounded trapezoidal shape, or a rounded tetragonal shape.

In an embodiment, each of the landing pads LP may include a contact silicide pattern 151, a barrier metal pattern 153, and a metal pattern 155.

The contact silicide pattern 151 may cover the top surface of the buried contact pattern BC and may be formed of or include at least one of, for example, titanium silicide, cobalt silicide, nickel silicide, tungsten silicide, platinum silicide, or molybdenum silicide. In an embodiment, the contact silicide pattern 151 may be omitted. The barrier metal pattern 153 may be formed of or include at least one of conductive metal nitrides (e.g., titanium nitride, tantalum nitride, and tungsten nitride). The metal pattern 155 may be formed of or include at least one metallic material (e.g., tungsten, titanium, and tantalum).

In an embodiment, a pad insulating pattern 161 may be provided to fill a region between the upper portions of the landing pads LP. The pad insulating pattern 161 may have a rounded bottom surface, and the bottom surface of the pad insulating pattern 161 may be in contact with portions of the bit line spacers SS. A top surface of the pad insulating pattern 161 may be coplanar with the top surfaces of the landing pads LP.

The pad insulating pattern 161 may contact the landing pads LP and the hard mask patterns 125 of the bit line structures BLS. The pad insulating pattern 161 may be formed of or include at least one of silicon oxide, silicon nitride, and/or silicon oxynitride. The pad insulating pattern 161 may be provided to have a single- or multi-layered structure.

In an embodiment, data storage patterns DS may be disposed on the landing pads LP, respectively. The data storage patterns DS may be electrically connected to the second impurity regions 1*b*, respectively, through the landing pads LP and the buried contact patterns BC. Each of the data storage patterns DS may be disposed to be offset from a corresponding one of the landing pads LP and may be in contact with a portion of each of the landing pads LP. In an embodiment, the data storage patterns DS may be arranged to form a honeycomb shape or a zigzag shape, when viewed in a plan view (e.g., adjacent rows of data storage patterns DS may be offset from each other).

In an embodiment, the data storage pattern DS may be a capacitor, which includes bottom and top electrodes and a dielectric layer therebetween. Alternatively, the data storage pattern DS may be a variable resistance pattern whose resistance can be switched to one of at least two states by an electric pulse applied thereto. For example, the data storage pattern DS may be formed of or include at least one of phase-change materials whose crystal state can be changed depending on an amount of a current applied thereto, perovskite compounds, transition metal oxides, magnetic materials, ferromagnetic materials, or antiferromagnetic materials.

FIGS. 5, 7, 9, 11, 13, 16, 18, 20, and 22 are plan views illustrating a method of fabricating a semiconductor memory device, according to an embodiment of the inventive concept. FIGS. 6A, 8A, 10A, 12A, 14A, 17A, 19A, 21A, and 23A are sectional views, which are taken along lines A-A' and B-B' of FIGS. 5, 7, 9, 11, 13, 16, 18, 20, and 22, respectively. FIGS. 6B, 8B, 10B, 12B, 14B, 17B, 19B, 21B, and 23B are sectional views, which are taken along lines C-C' and D-D' of FIGS. 5, 7, 9, 11, 13, 16, 18, 20, and 22, respectively. FIG. 15 is a perspective view illustrating some steps in a process of fabricating a semiconductor memory device, according to an embodiment of the inventive concept.

Figure 5:
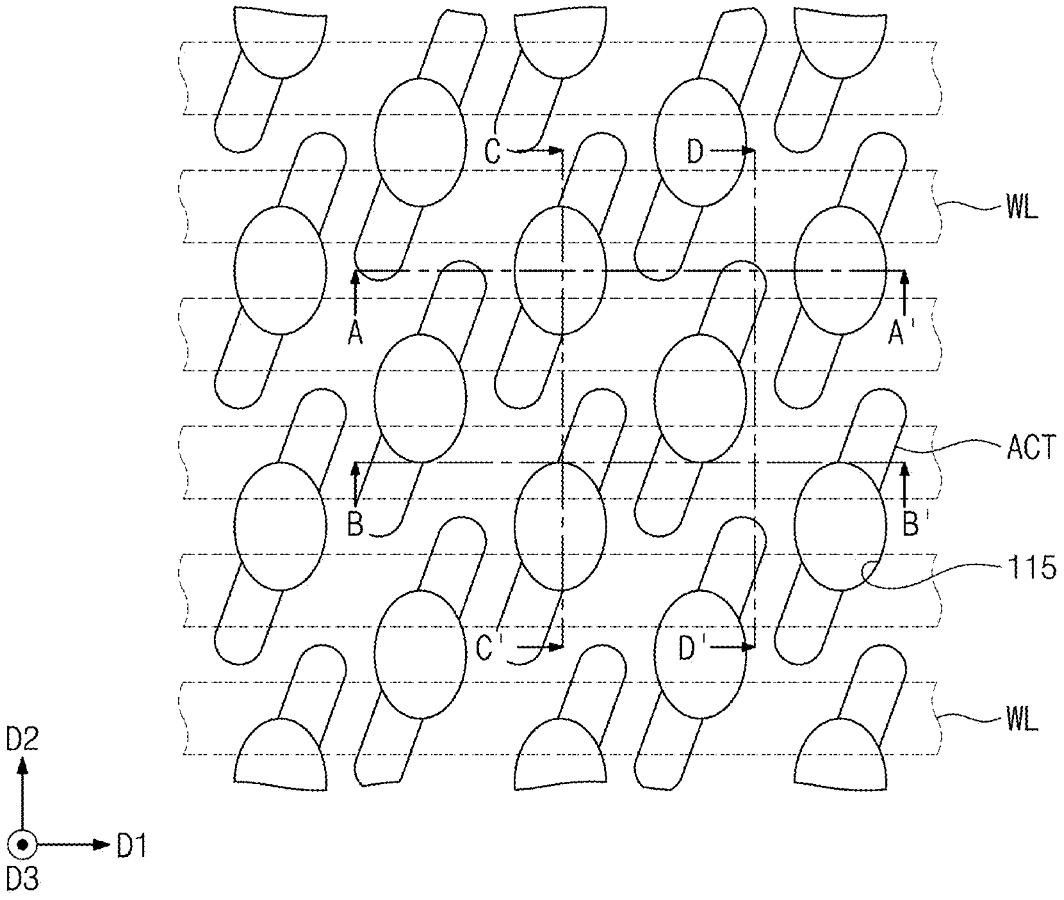
FIGS. 5, 7, 9, 11, 13, 16, 18, 20, 22, and 24 are plan views illustrating a method of fabricating a semiconductor memory device, according to an embodiment of the inventive concept.
Figure 6A:
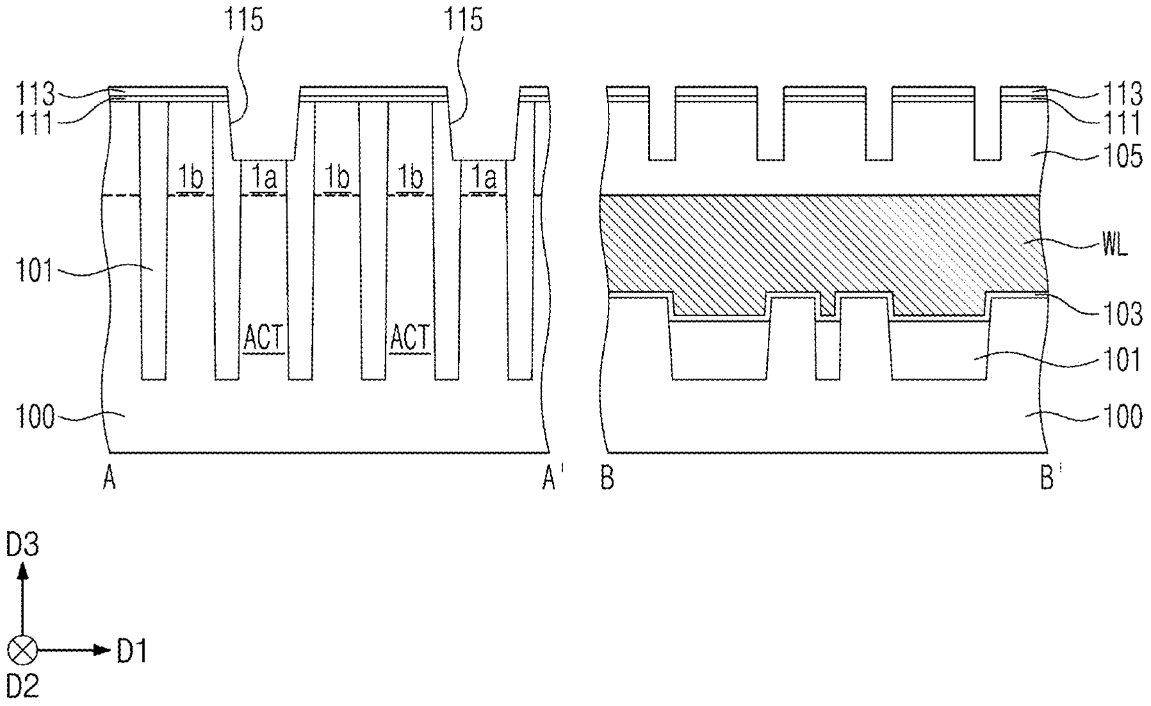
FIGS. 6A, 8A, 10A, 12A, 14A, 17A, 19A, 21A, 23A, and 25A are sectional views, which are taken along lines A-A' and B-B' of FIGS. 5, 7, 9, 11, 13, 16, 18, 20, 22, and 24 respectively.
Figure 6B:
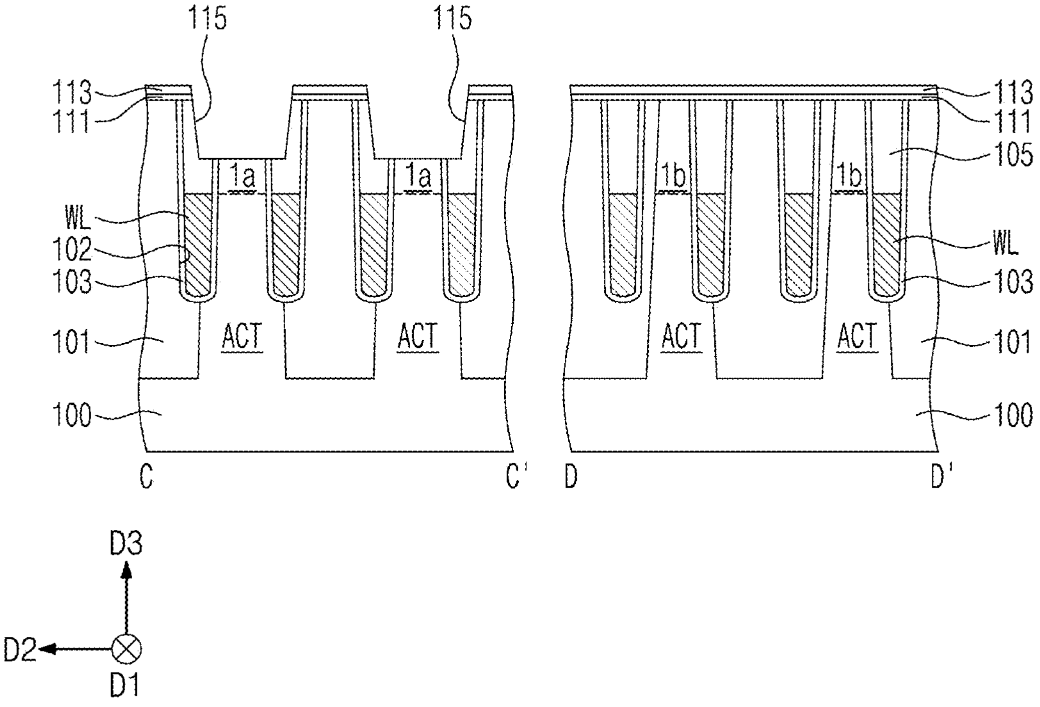
FIGS. 6B, 8B, 10B, 12B, 14B, 17B, 19B, 21B, 23B, and 25B are sectional views, which are taken along lines C-C' and D-D' of FIGS. 5, 7, 9, 11, 13, 16, 18, 20, 22, and 24 respectively.

Referring to FIGS. 5, 6A, and 6B, the device isolation layer 101 may be formed in the semiconductor substrate 100 to define the active portions ACT.

In an embodiment, the active portions ACT may have a rectangular or bar shape and may be two-dimensionally arranged in the first and second directions D1 and D2. When viewed in a plan view, the active portions ACT may be arranged in a staggered manner (e.g., zigzag shape) and may have a long axis that is inclined at an angle with respect to both of the first and second directions D1 and D2 (e.g., the long axis may extend diagonally in relation to the first and second directions D1 and D2).

The word lines WL may be formed on the semiconductor substrate 100 to extend (e.g., lengthwise) in the first direction D1. An item, layer, or portion of an item or layer described as extending "lengthwise" in a particular direction has a length in the particular direction and a width perpendicular to that direction, where the length is greater than the width.

In detail, the active portions ACT and the device isolation layer 101 may be patterned to form gate recess regions 102 extending in the first direction D1, and a gate insulating layer 103 and the word lines WL may be sequentially formed in the gate recess regions 102. The gate recess regions 102 may have bottom surfaces that are located at a level higher than a bottom surface of the device isolation layer 101. The top surfaces of the word lines WL may be formed at a level lower than the top surface of the device isolation layer 101.

The gate insulating layer 103 may be formed of or include at least one of, for example, high-k dielectric materials, silicon oxide, silicon nitride, or silicon oxynitride and may have a single- or multi-layered structure. Here, the high-k dielectric materials may include hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The gate capping patterns 105 may be formed in the gate recess regions 102 provided with the word lines WL. The gate capping patterns 105 may have top surfaces that are located at substantially the same level as the top surface of the semiconductor substrate 100 and the top surface of the device isolation layer 101. The gate capping patterns 105 may be formed of or include an insulating material different from the device isolation layer 101. For example, the gate capping patterns 105 may include a silicon nitride layer and/or a silicon oxynitride layer.

After the formation of the word lines WL, the first and second impurity regions 1*a* and 1*b* may be formed in portions of the active portions ACT at both sides of the word lines WL. The first and second impurity regions 1*a* and 1*b* may be formed by an ion implantation process and may have a conductivity type different from the active portion ACT. Active portions may also be described as active regions.

Next, the first and second buffer insulating layers 111 and 113 may be sequentially formed on the semiconductor substrate 100.

The first buffer insulating layer 111 may be formed to cover the top surface of the device isolation layer 101 and the top surface of the semiconductor substrate 100. In an embodiment, the first and second buffer insulating layers 111 and 113 may include or be formed of a silicon oxide layer, a silicon nitride layer, and/or a silicon oxynitride layer. As an example, the first buffer insulating layer 111 may be a silicon oxide layer, and the second buffer insulating layer 113 may be a silicon nitride layer. Alternatively, one of the first and second buffer insulating layers 111 and 113 may be omitted. The second buffer insulating layer 113 may be thicker than the first buffer insulating layer 111.

Thereafter, the semiconductor substrate 100 and the first and second buffer insulating layers 111 and 113 may be patterned to form recess regions 115 exposing the first impurity regions 1*a*, respectively. In an embodiment, the recess regions 115 may have an elliptical (generally described as oval) shape whose long axis is parallel to the second direction D2. The recess regions 115 may be arranged in a zigzag or honeycomb shape (e.g., so that adjacent rows are staggered), when viewed in a plan view.

In an embodiment, the recess regions 115 may be formed by an anisotropic etching process, and in this case, the device isolation layer 101 and the gate capping patterns 105, which are adjacent to the first impurity regions 1*a*, may be partially etched during the anisotropic etching process. The recess regions 115 may be formed to have bottom surfaces that are located at a level higher than a bottom surface of the first impurity regions 1*a*, and the device isolation layer 101 and the gate capping pattern 105 may be partially exposed to the recess region 115.

Figure 7:
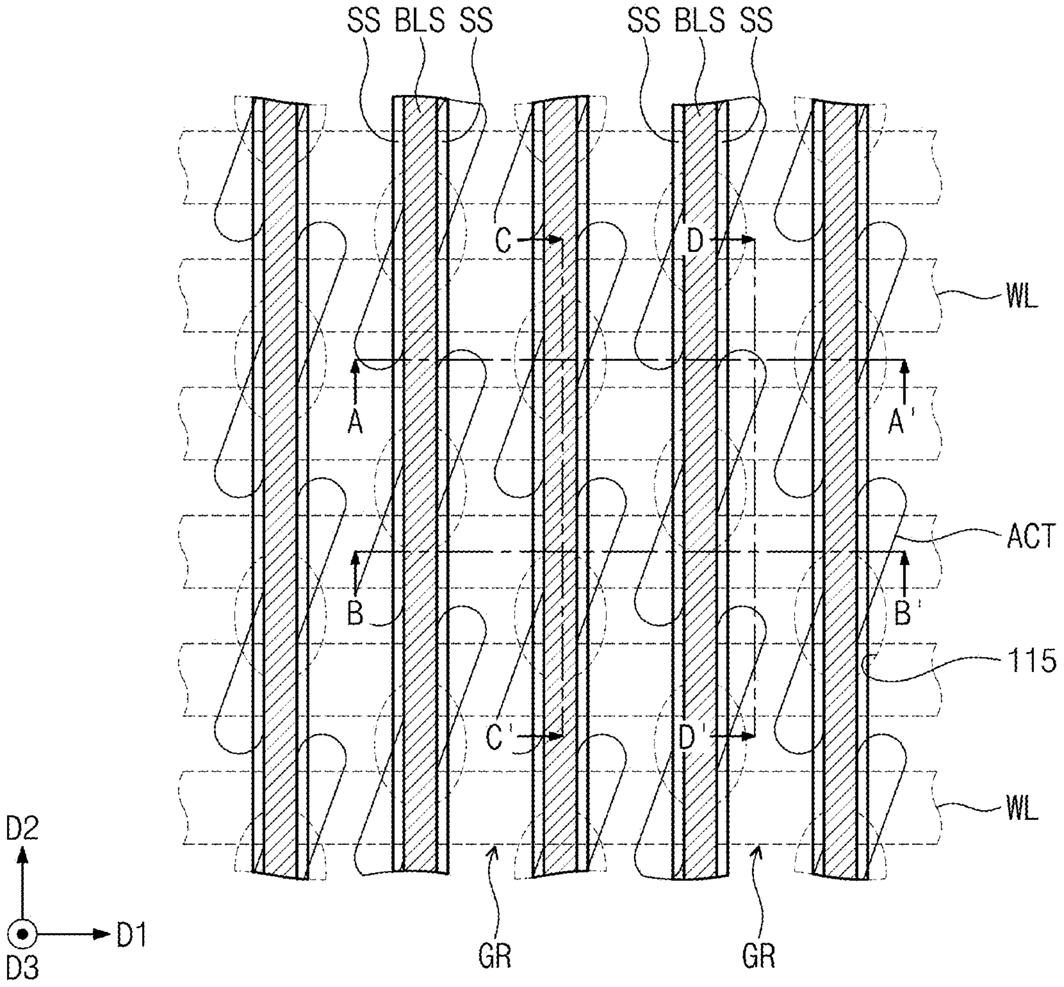
Figure 8A:
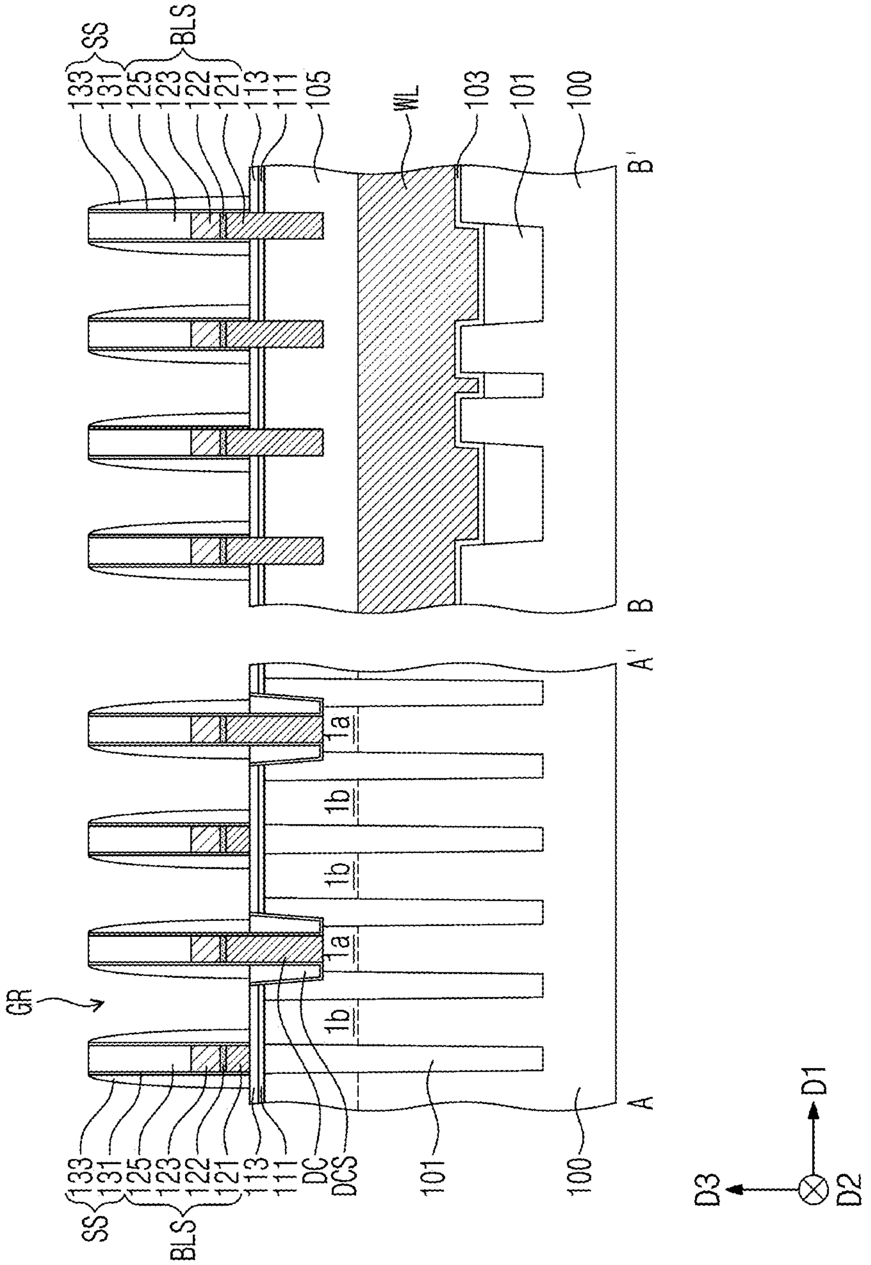
Figure 8B:
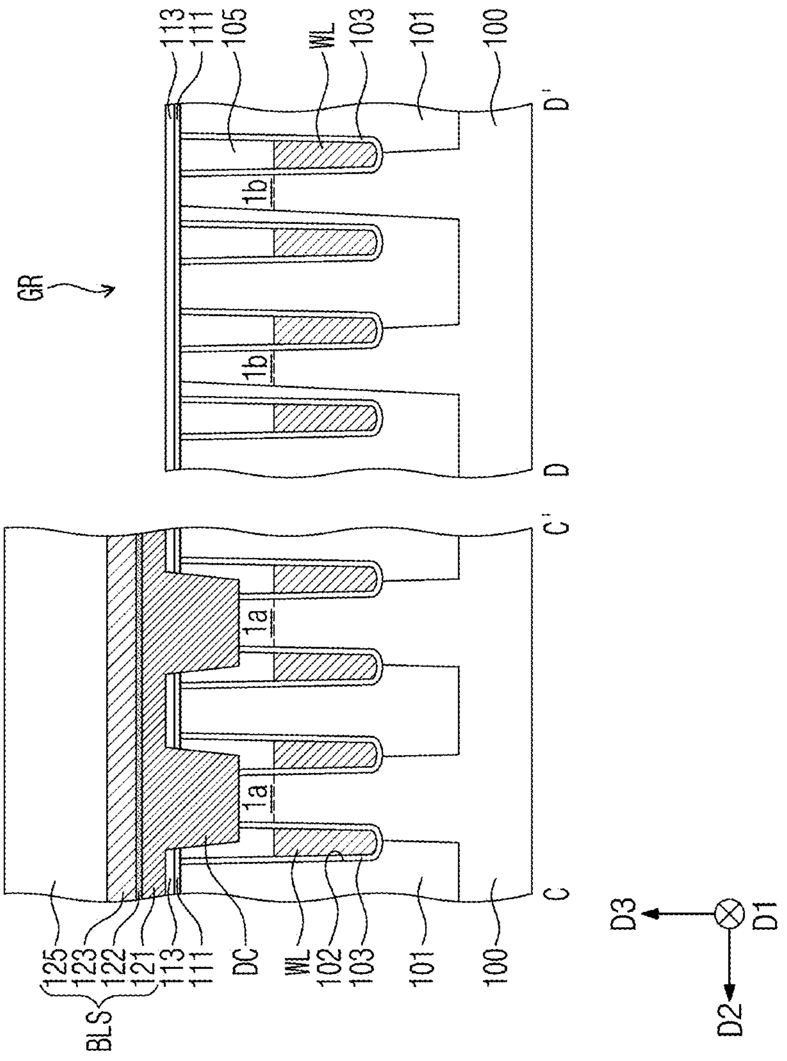

Referring to FIGS. 7, 8A, and 8B, the bit line structures BLS extending in the second direction D2 may be formed on the second buffer insulating layer 113, through which the recess regions 115 are formed.

The formation of the bit line structures BLS may include forming a first conductive layer on the second buffer insulating layer 113 to fill the recess regions 115, forming a second conductive layer on the first conductive layer, forming a hard mask layer on the second conductive layer, forming a bit line mask pattern on the hard mask layer, and sequentially etching the first conductive layer, the second conductive layer, and the hard mask layer using the bit line mask pattern. Thereafter, the bit line mask pattern may be removed. Here, the first conductive layer may be a doped semiconductor layer (e.g., a doped poly-silicon layer), and the second conductive layer may be a metal layer (e.g., a tungsten layer, an aluminum layer, a titanium layer, or a tantalum layer). In an embodiment, a metal silicide layer may be formed between the first conductive layer and the second conductive layer.

In the case where the bit line structures BLS are formed by the afore-described method, each of the bit line structures BLS may include the polysilicon pattern 121, the silicide pattern 122, the metal pattern 123, and the hard mask pattern 125, which are sequentially stacked here, a portion of the polysilicon pattern 121 may be locally formed in the recess region 115 and may be used as the bit line contact pattern DC that contacts the first impurity region 1*a*. The polysilicon pattern 121 may have side surfaces that are spaced apart from side surfaces of the recess regions 115.

The bit line spacers SS may be formed on the side surfaces of the bit line structures BLS.

The bit line spacers SS may extend along the opposite side surfaces of the bit line structures BLS or in the second direction D2. In an embodiment, portions of the bit line spacers SS may fill the recess regions 115.

The bit line spacers SS may include the first and second spacers 131 and 133. In an embodiment, the bit line spacers SS may further include a third spacer that is provided on the second spacer 133.

In more detail, the formation of the bit line spacers SS may include sequentially depositing first and second spacer layers to conformally cover the bit line structures BLS and sequentially and anisotropically etching the first and second spacer layers to form the first and second spacers 131 and 133. Here, the second spacer layer may be formed of or include an insulating material having an etch selectivity with respect to the first spacer layer. As an example, the first spacer layer may be a silicon oxide layer, and the second spacer layer may be a silicon nitride layer.

The first spacer layer may be used as an etch stop layer, when the second spacer layer is anisotropically etched, and the second buffer insulating layer 113 may be used as an etch stop layer, when the first spacer layer is anisotropically etched.

When the second spacer 133 is formed, a portion of the second spacer layer may be locally left in the recess regions 115 and may be used as the bit line contact spacer DCS. The first spacer 131 may include a lower portion, which is formed in the recess region 115, and an upper portion, which is formed to cover the side surface of the bit line structure BLS. The lower portion of the first spacer 131 may also constitute the bit line contact spacer DCS.

After the formation of the bit line spacers SS, a gap region GR, which extends in the second direction D2 and has a line shape, may be formed between the bit line structures BLS. The gap region GR may be formed to expose a top surface of the second buffer insulating layer 113.

Figure 9:
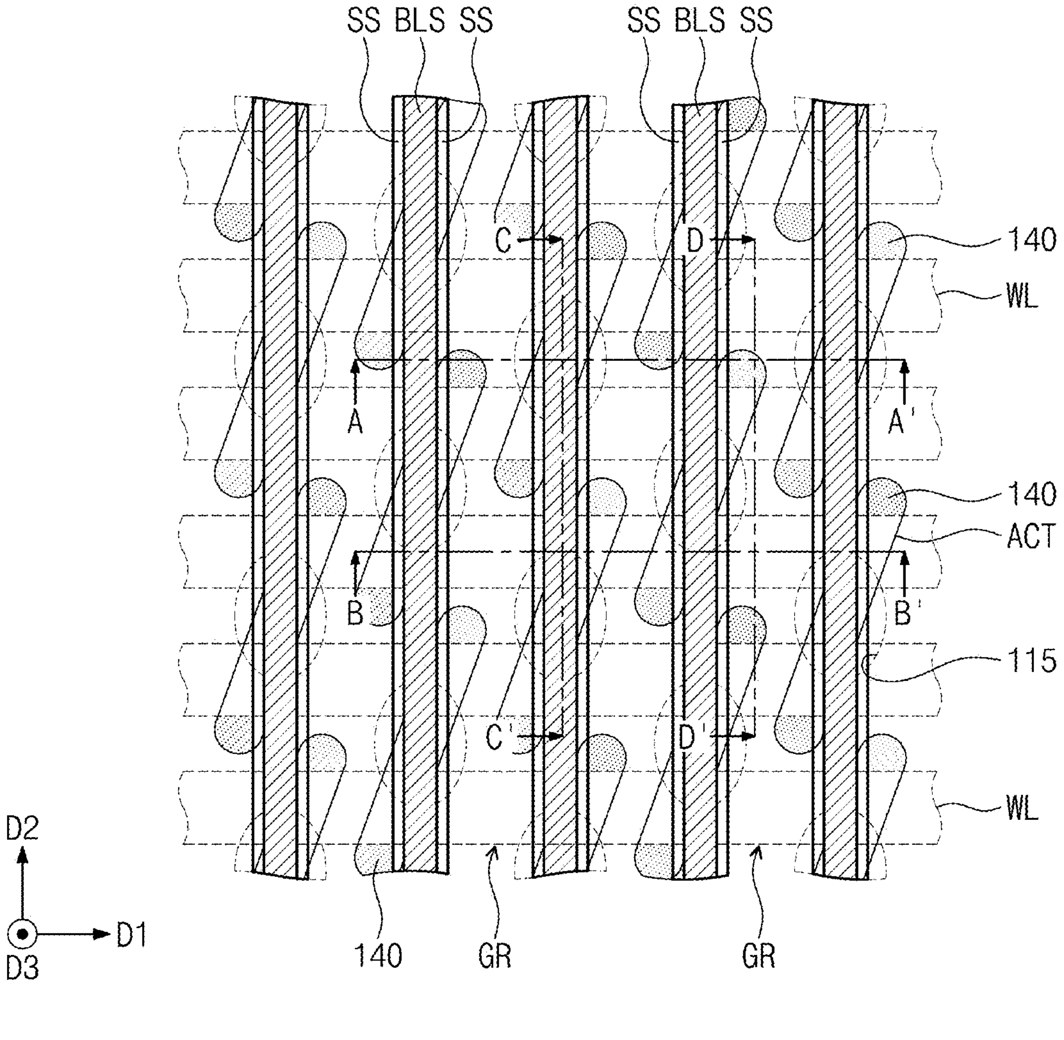
Figure 10A:
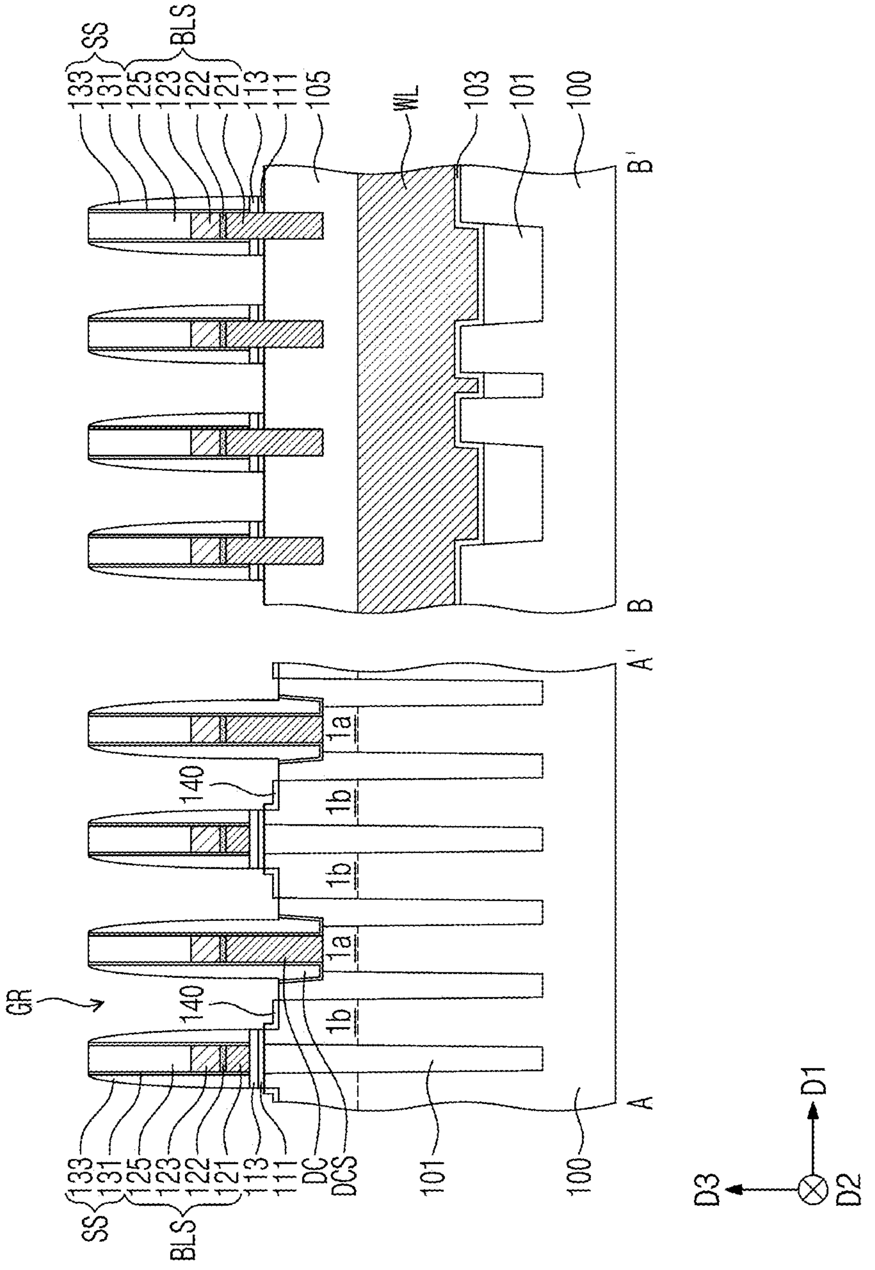
Figure 10B:
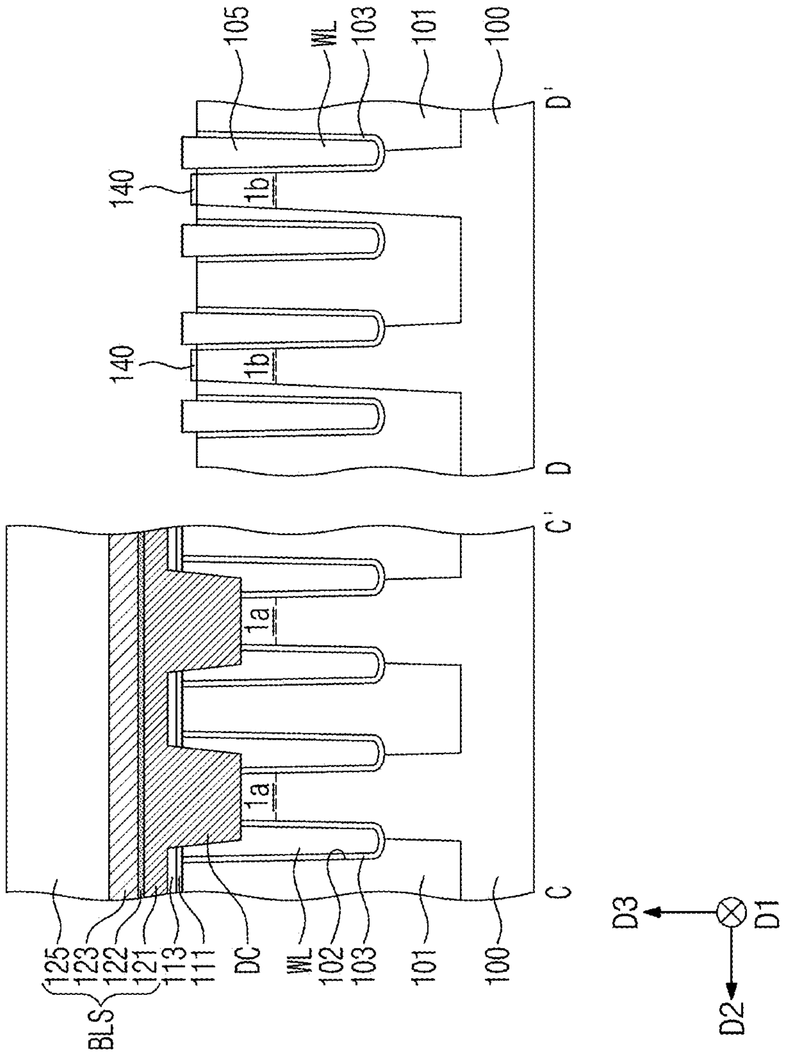

Referring to FIGS. 9, 10A, and 10B, an anisotropic etching process using the bit line spacers SS and the bit line structures BLS as an etch mask may be performed on the first and second buffer insulating layers 111 and 113.

As a result of the anisotropic etching of the first and second buffer insulating layers 111 and 113, the top surface of the device isolation layer 101 and the top surface of the semiconductor substrate 100 may be exposed through the line-shaped gap region GR.

Next, a first etching process may be performed to recess the top surface of the device isolation layer 101, and a second etching process may be performed to recess the semiconductor substrate 100. The first and second etching processes may be performed using an etch recipe that has an etch selectivity with respect to the gate capping pattern 105, the bit line spacers SS, and the bit line structures BLS. As a result of the first and second etching processes, the top surface of the semiconductor substrate 100 as well as side surfaces of the semiconductor substrate 100 (e.g., top surfaces and side surfaces of active portions ACT (e.g., 1*b*)) may be exposed, and the top surface of the device isolation layer 101 and the top surface of the semiconductor substrate 100 may be located at a level lower than the top surface of the gate capping pattern 105. For example, the gate capping pattern 105 may have upper portions protruding above the top surface of the semiconductor substrate 100. As a result of the afore-described recessing of the semiconductor substrate 100 and the device isolation layer 101, an area of the active portion ACT or the second impurity region 1*b*, which is exposed through the gap region GR (e.g., an area of the top surface of the active portion), may be increased.

Thereafter, a selective oxidation process may be performed to selectively form a protection oxide layer 140 on the surface of the active portion ACT that is exposed by the gap region GR.

Figure 11:
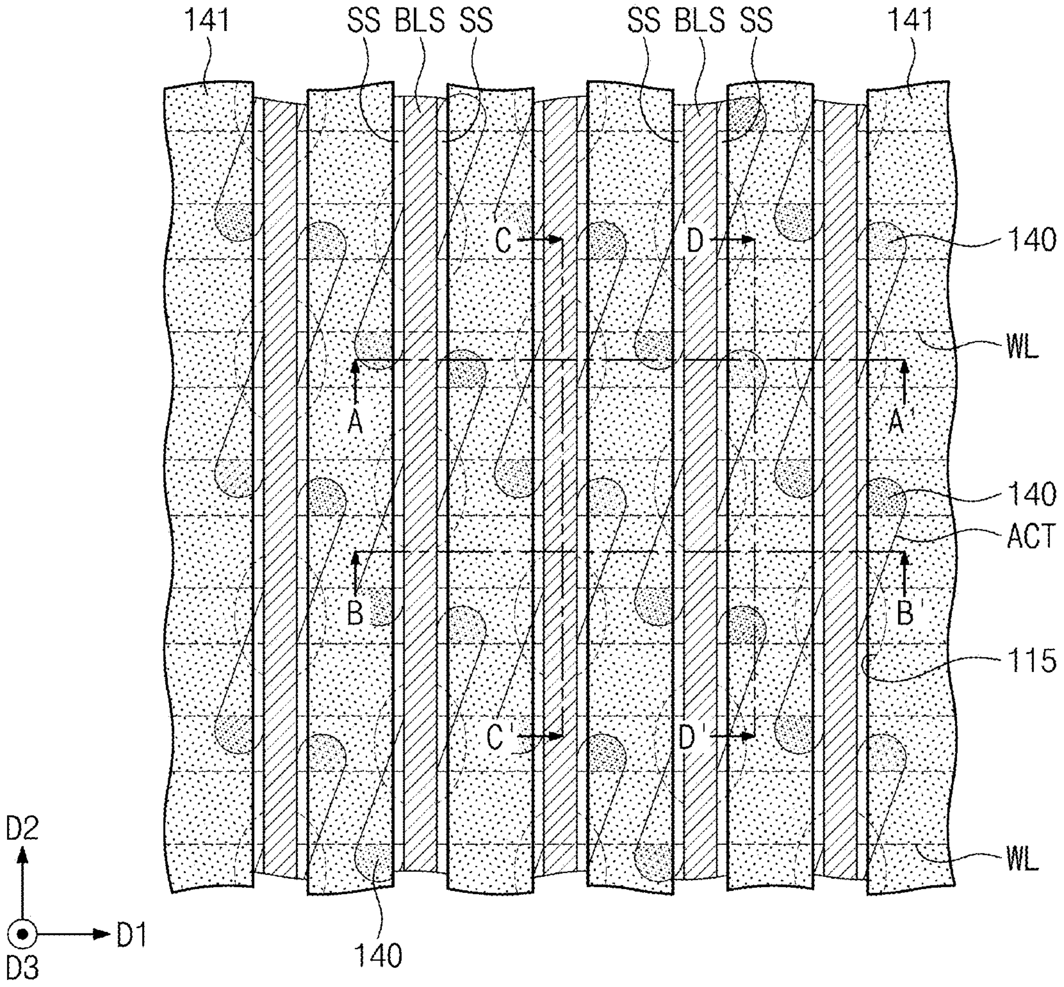
Figure 12A:
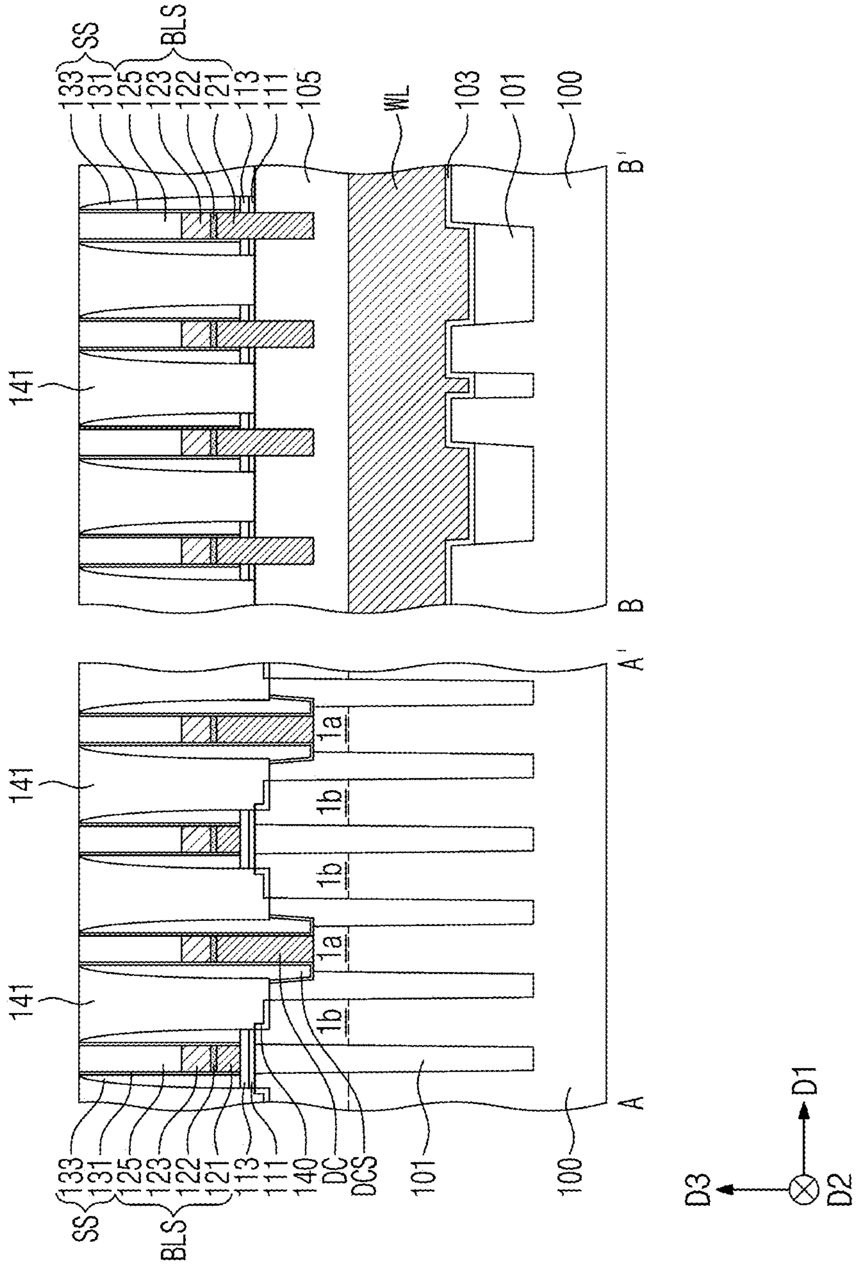
Figure 12B:
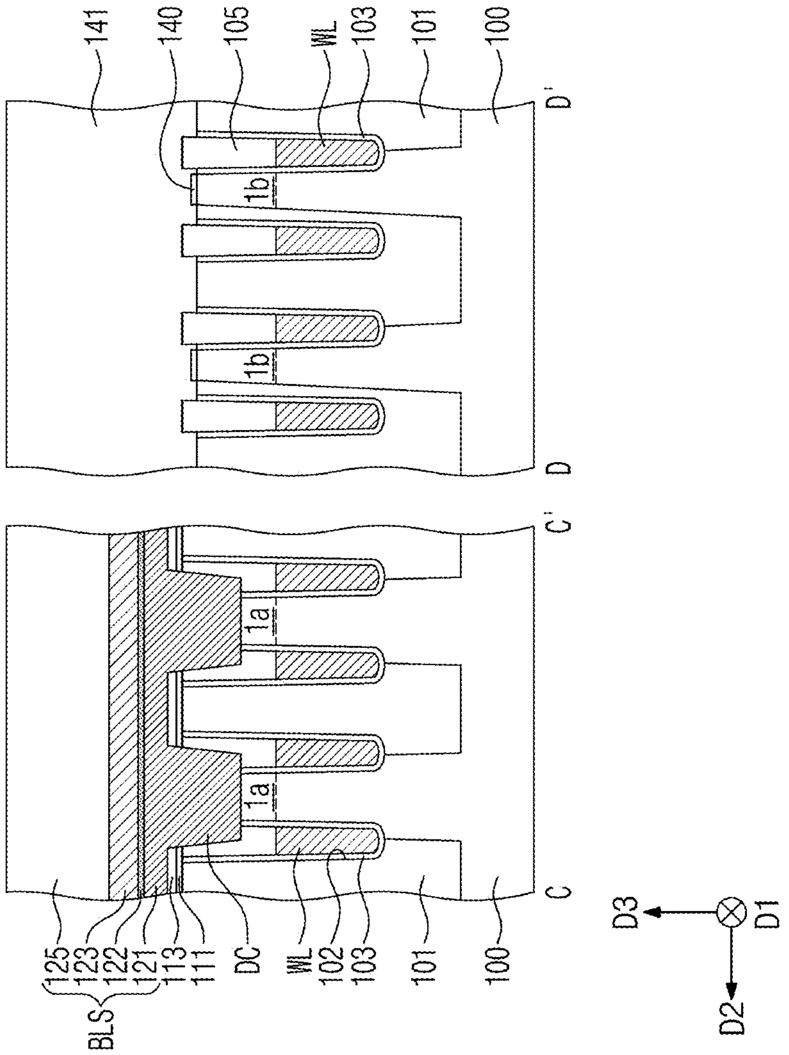

Referring to FIGS. 11, 12A, and 12B, a mold layer 141 may be formed in the line-shaped gap regions GR provided with the protection oxide layer 140. The mold layer 141 may be formed of or include a material that has an etch selectivity with respect to the bit line spacers SS, the bit line structures BLS, and the device isolation layer 101. For example, the mold layer 141 may be formed of or include at least one of undoped poly-silicon or spin-on-hardmask (SOH) materials (e.g., SOH silicon oxide).

The formation of the mold layer 141 may include depositing an undoped poly-silicon layer and performing a planarization process to expose top surfaces of the bit line structures BLS. Since the poly-silicon layer is formed to fill the line-shaped gap region GR, a line-shaped void or seam, which extends in the second direction D2, may be formed in the poly-silicon layer, during the deposition of the poly-silicon layer. After the deposition of the poly-silicon layer, a rapid thermal annealing (RTA) process may be performed to cure crystal defects in the poly-silicon layer. In an embodiment, since the mold layer 141 is formed of undoped polysilicon, it may be possible to reduce a process temperature or energy for the thermal treatment process.

Figure 13:
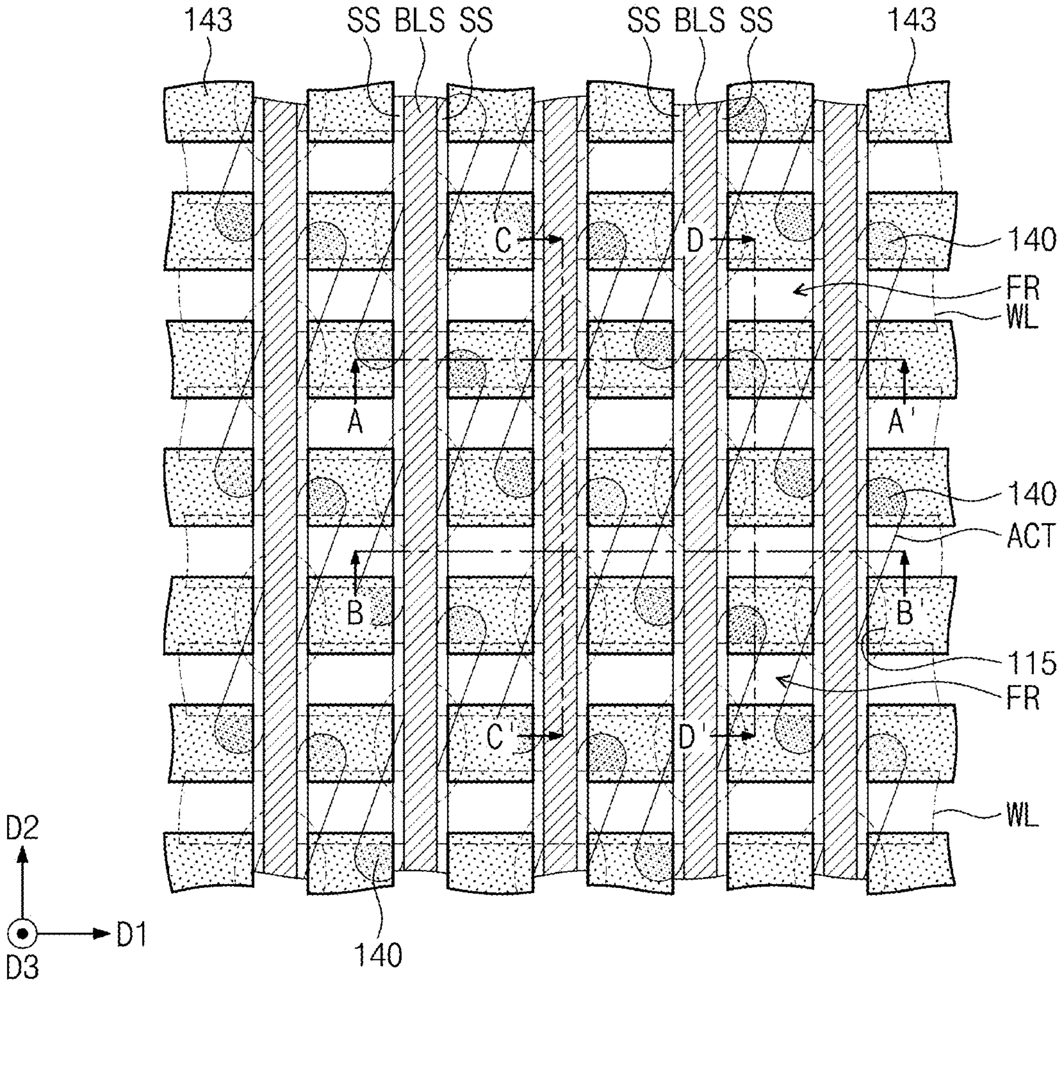
Figure 14A:
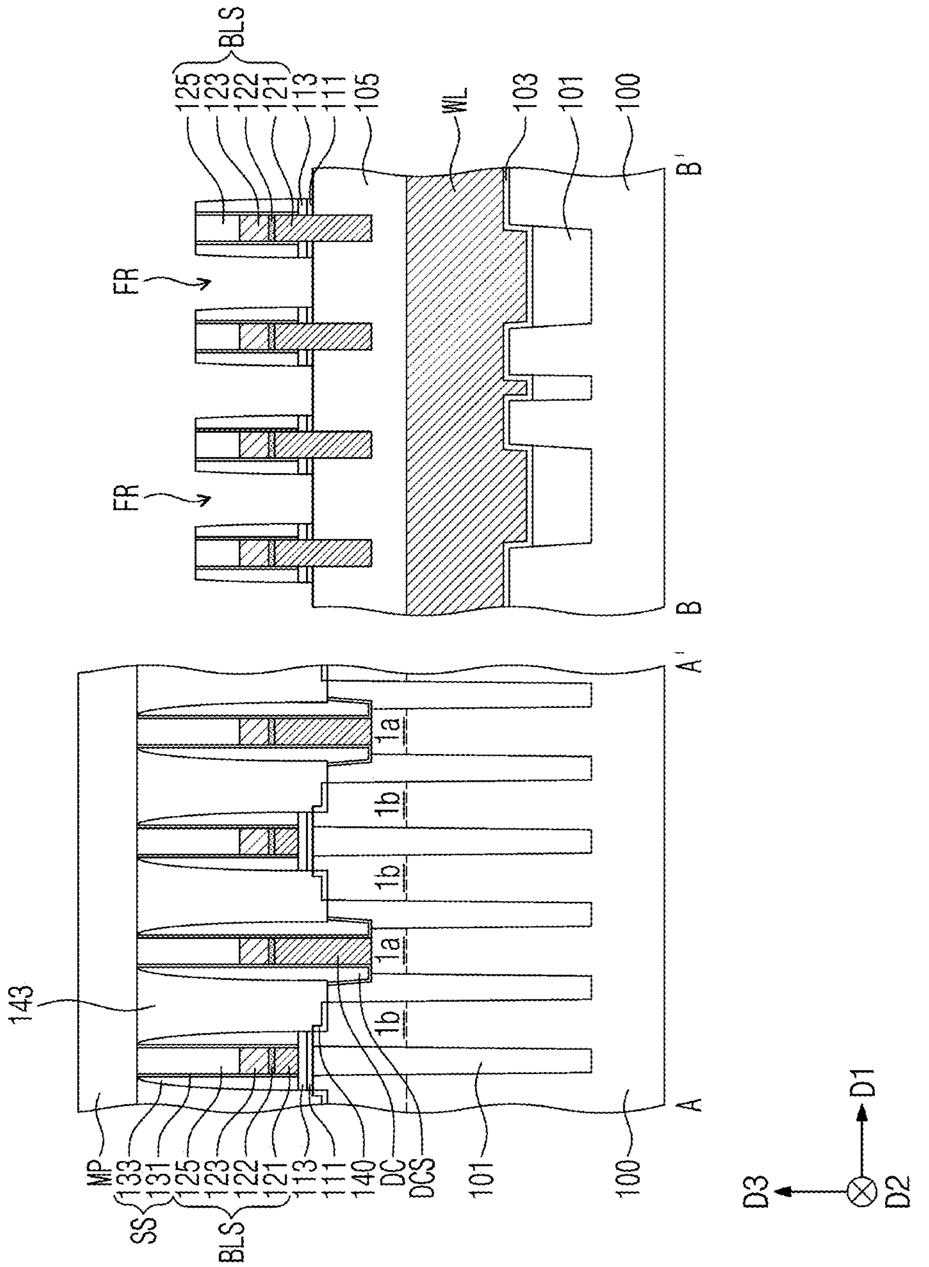
Figure 14B:
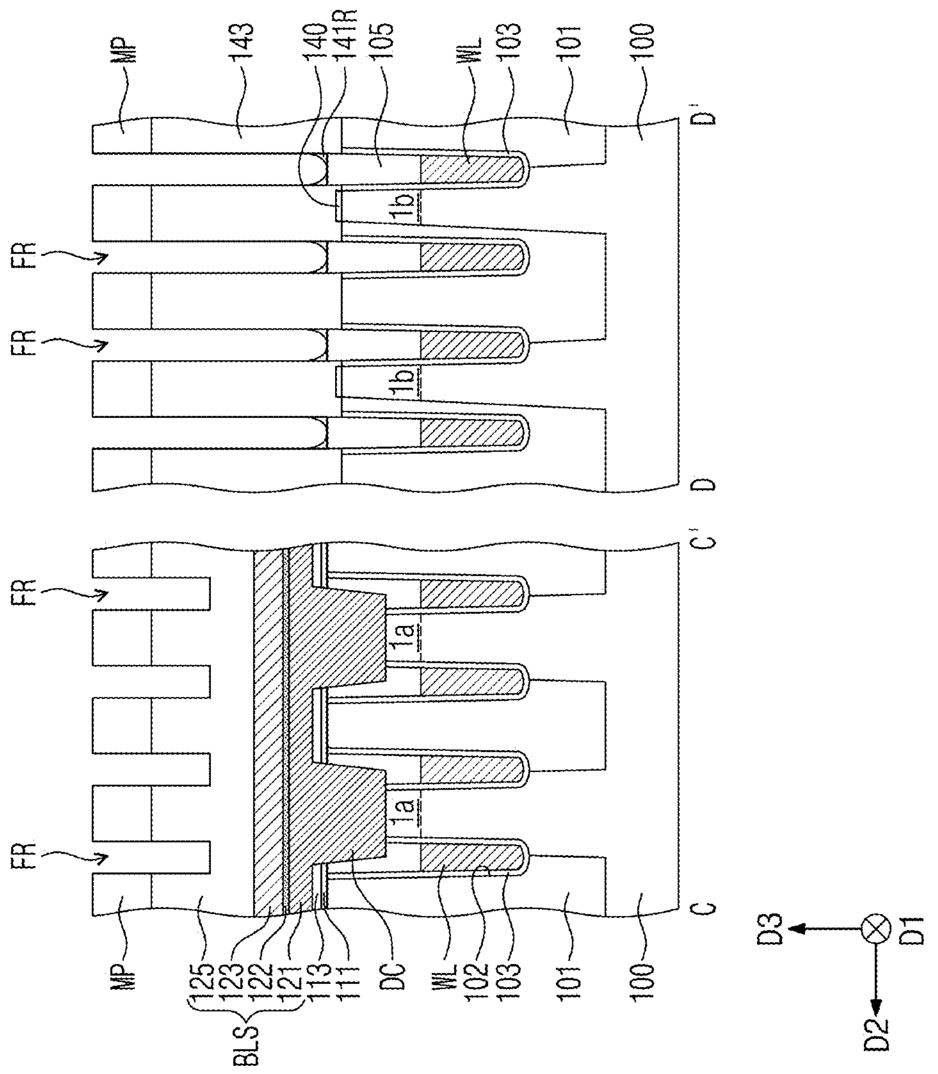
Figure 15:
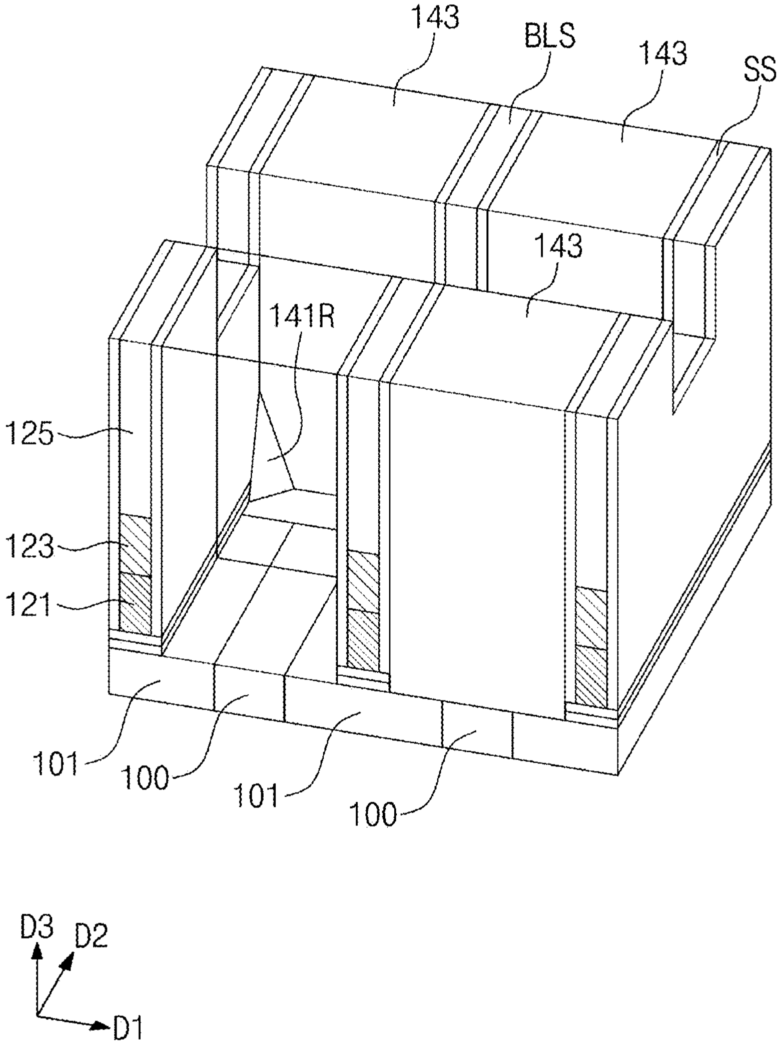
FIG. 15 is a perspective view illustrating some steps in a process of fabricating a semiconductor memory device, according to an embodiment of the inventive concept.

Referring to FIGS. 13, 14A, and 14B, mask patterns MP extending in the first direction D1 may be formed on the bit line structures BLS and the mold layer 141. The mask patterns MP may be disposed between the word lines.

Mold patterns 143, which expose the gate capping patterns 105 on the word lines WL, may be formed by anisotropically etching the mold layer 141 using the mask patterns MP as an etch mask. Accordingly, a fence region FR, which is overlapped with the gate capping patterns 105, may be formed. Portions of the bit line structures BLS and portions of the bit line spacers SS may be etched during the anisotropic etching process on the mold layer 141. Thus, a depth of the fence region FR on the bit line structures BLS may be smaller than a depth of the fence region FR between the bit line structures BLS. The mold patterns 143 between the bit line structures BLS may be spaced apart from each other in the second direction D2.

Referring to FIGS. 14B and 15, due to a three-dimensional effect, a portion 141R (hereinafter, a stringer, or a corner residue portion) of the mold layer 141 may be left in corner portions of the fence region FR between the bit line structures BLS after the anisotropic etching process on the mold layer 141.

Figure 16:
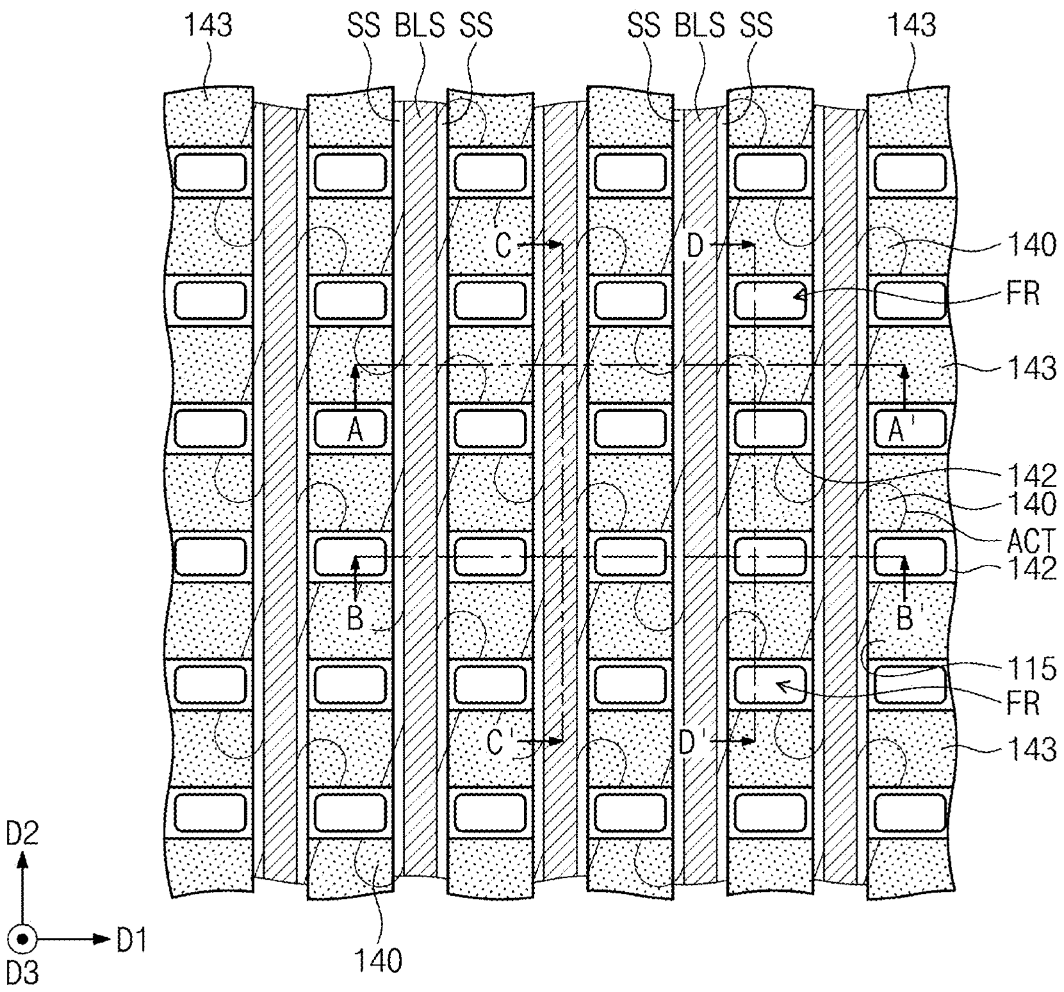
Figure 17A:
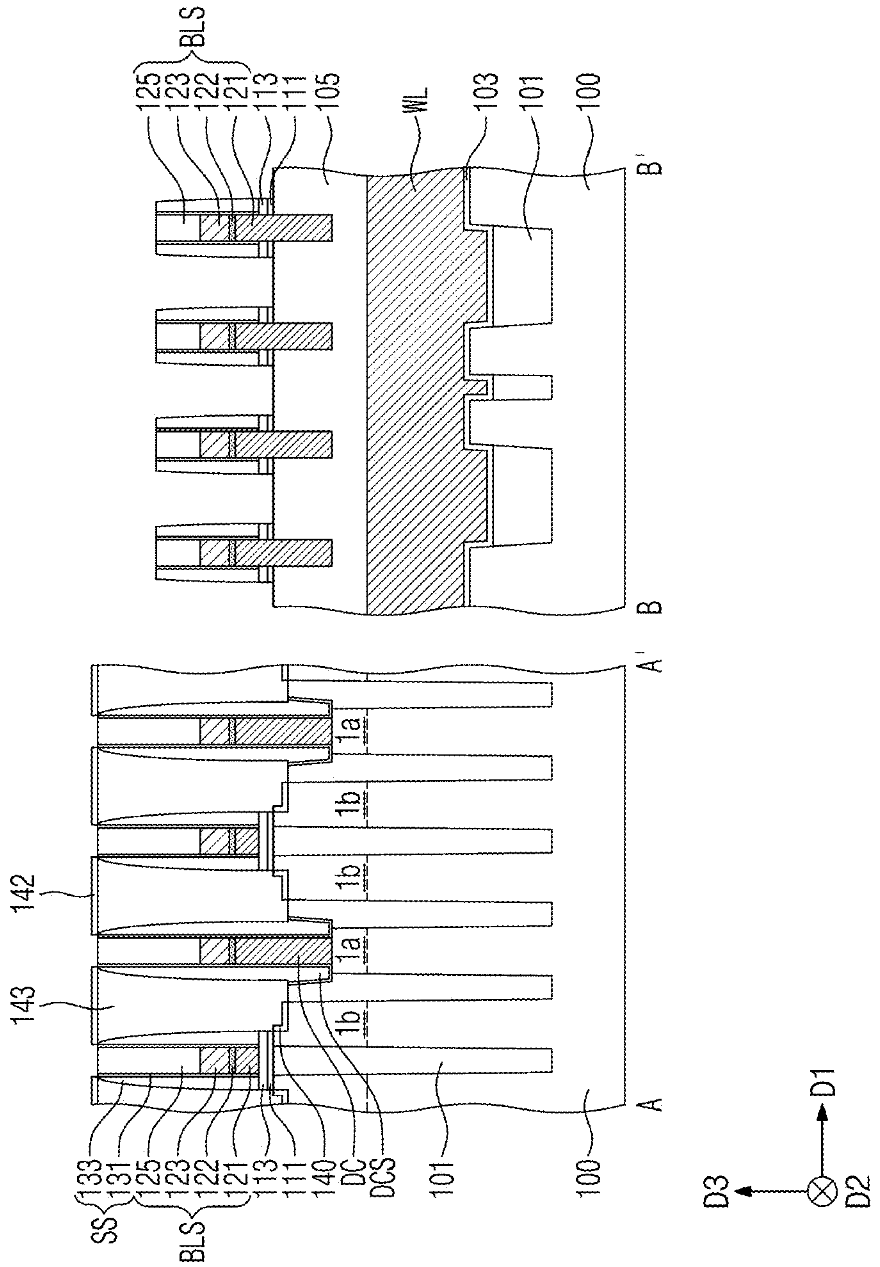
Figure 17B:
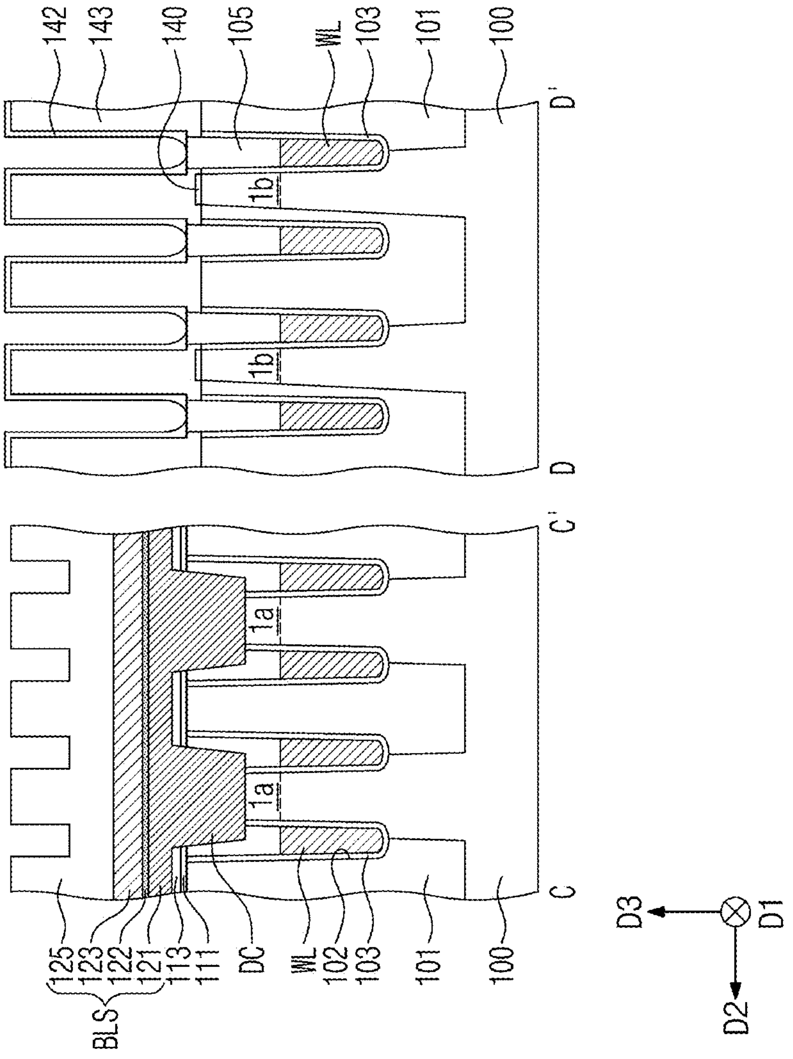

Referring to FIGS. 16, 17A, and 17B, in order to remove the stringer 141R left in the fence region FR, an oxidation process, not an over-etch process, may be performed to oxidize surfaces of the stringer 141R and the mold pattern 143. Accordingly, the polysilicon stringer 141R, which is left in the fence region FR, may be oxidized to form an oxide stringer 141R, and a buffer oxide layer 142 may be formed on the surface of the mold pattern 143.

Figure 18:
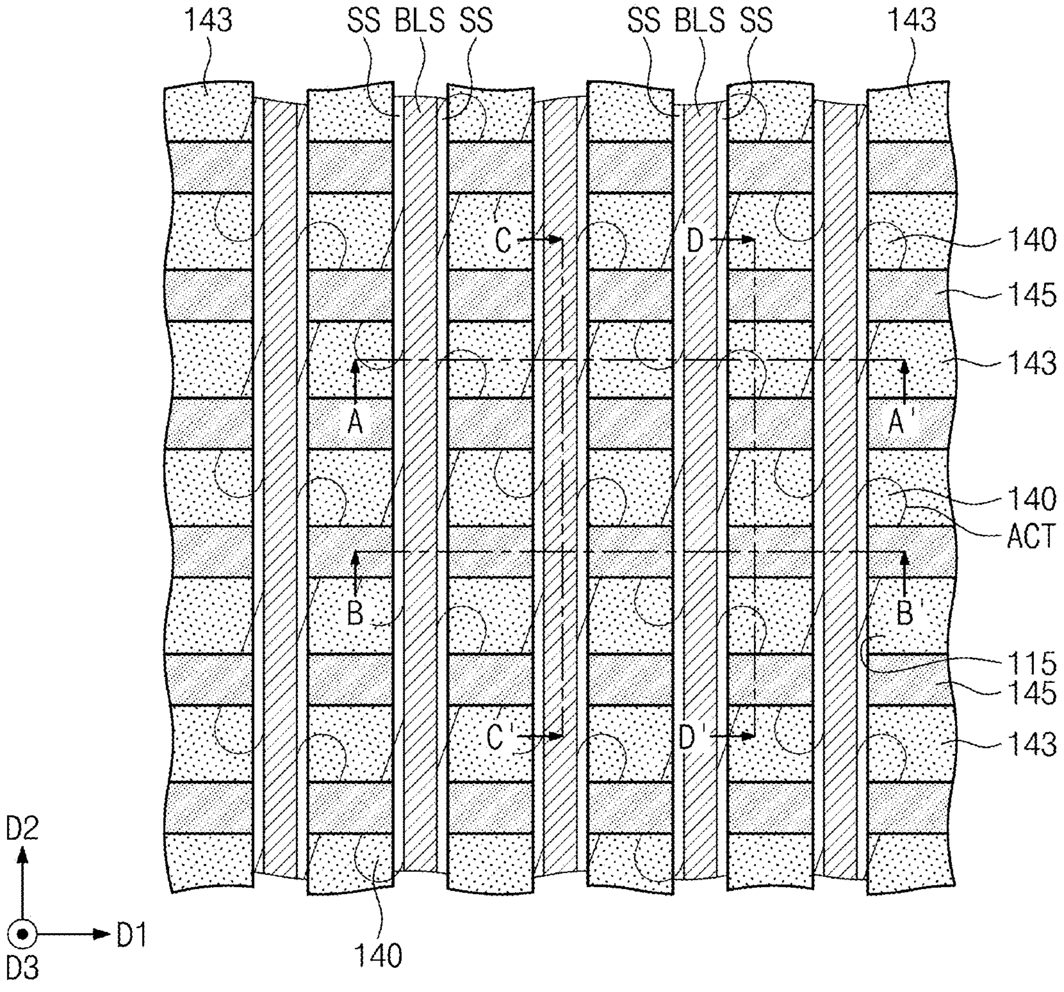
Figure 19A:
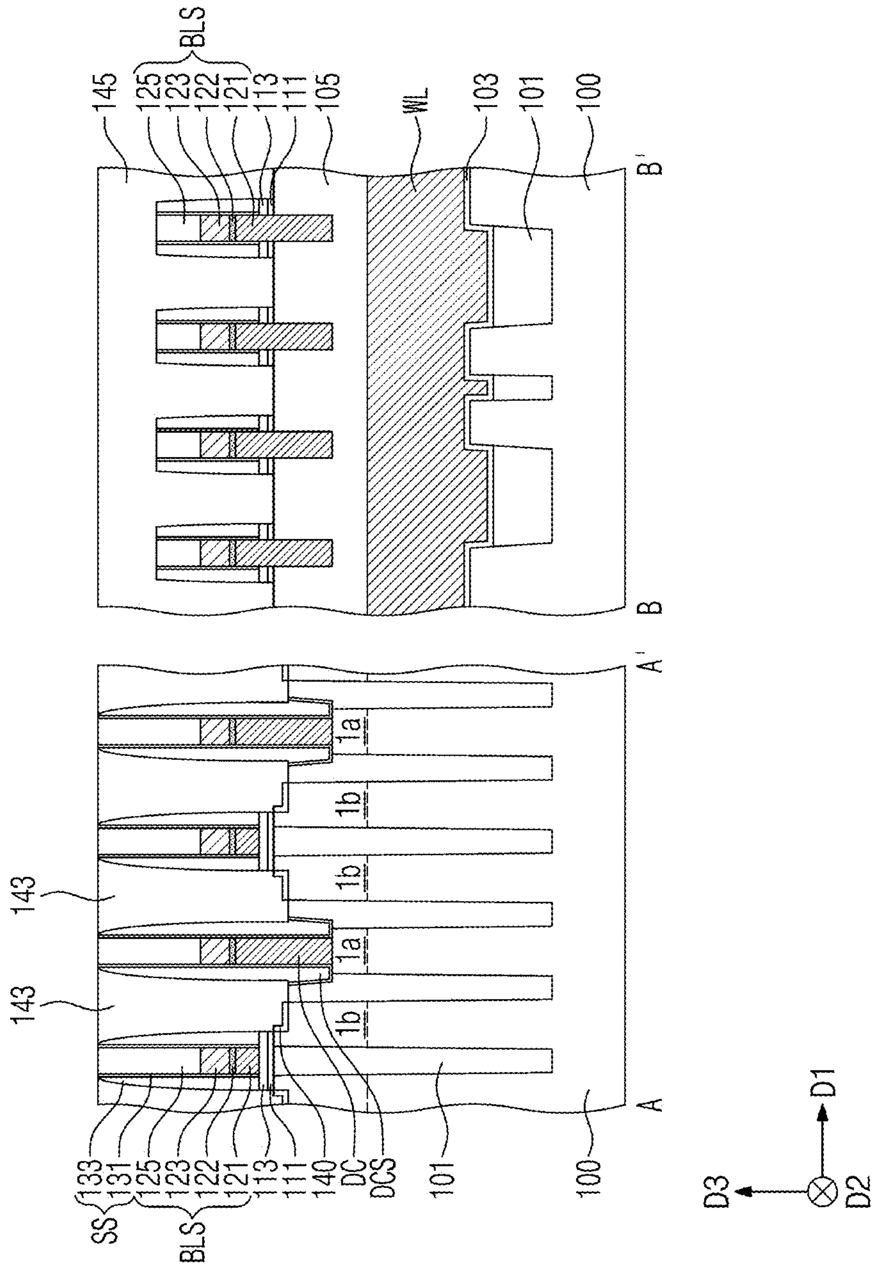
Figure 19B:
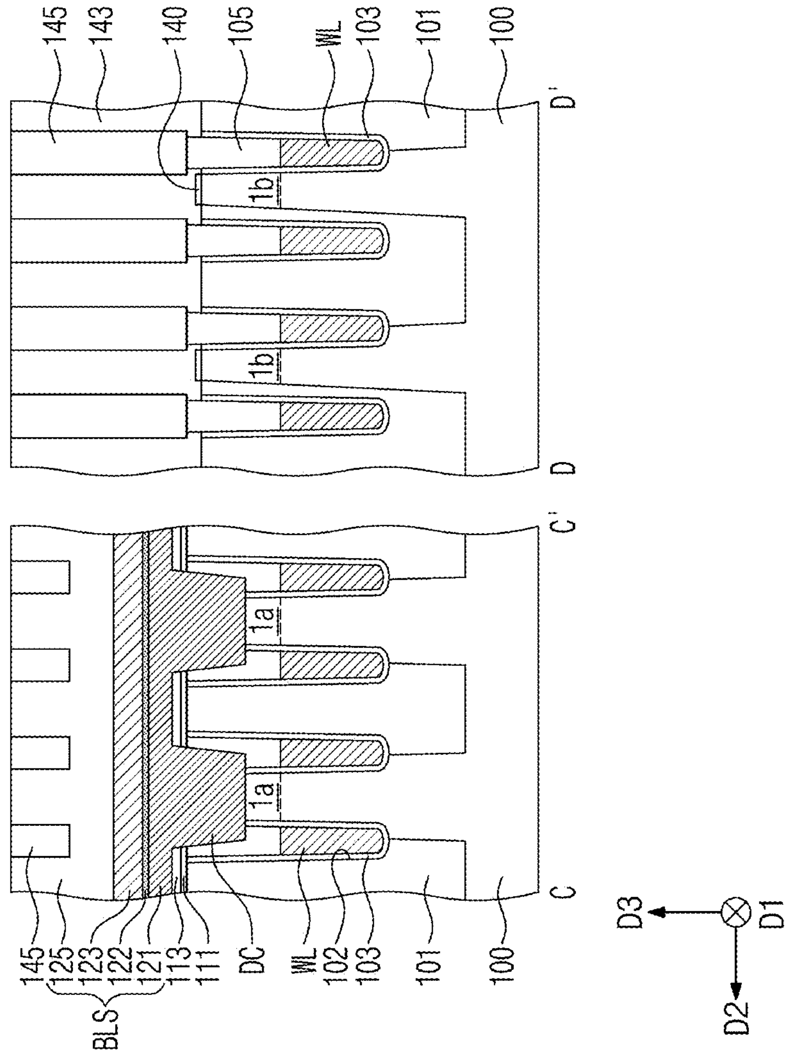

Next, referring to FIGS. 18, 19A, and 19B, the buffer oxide layer 142 may be removed using etching solution containing hydrofluoric (HF) acid, and then, the fence patterns 145 may be formed in the fence regions FR.

The fence patterns 145 may be formed to fill the fence region FR, which is defined by the mold patterns 143 and the bit line structures BLS, and may overlap the word lines WL, when viewed in a plan view. The fence patterns 145 may be formed of or include at least one of insulating materials (e.g., silicon oxide, silicon nitride, and/or silicon oxynitride), which have an etch selectivity with respect to the mold patterns 143.

Figure 20:
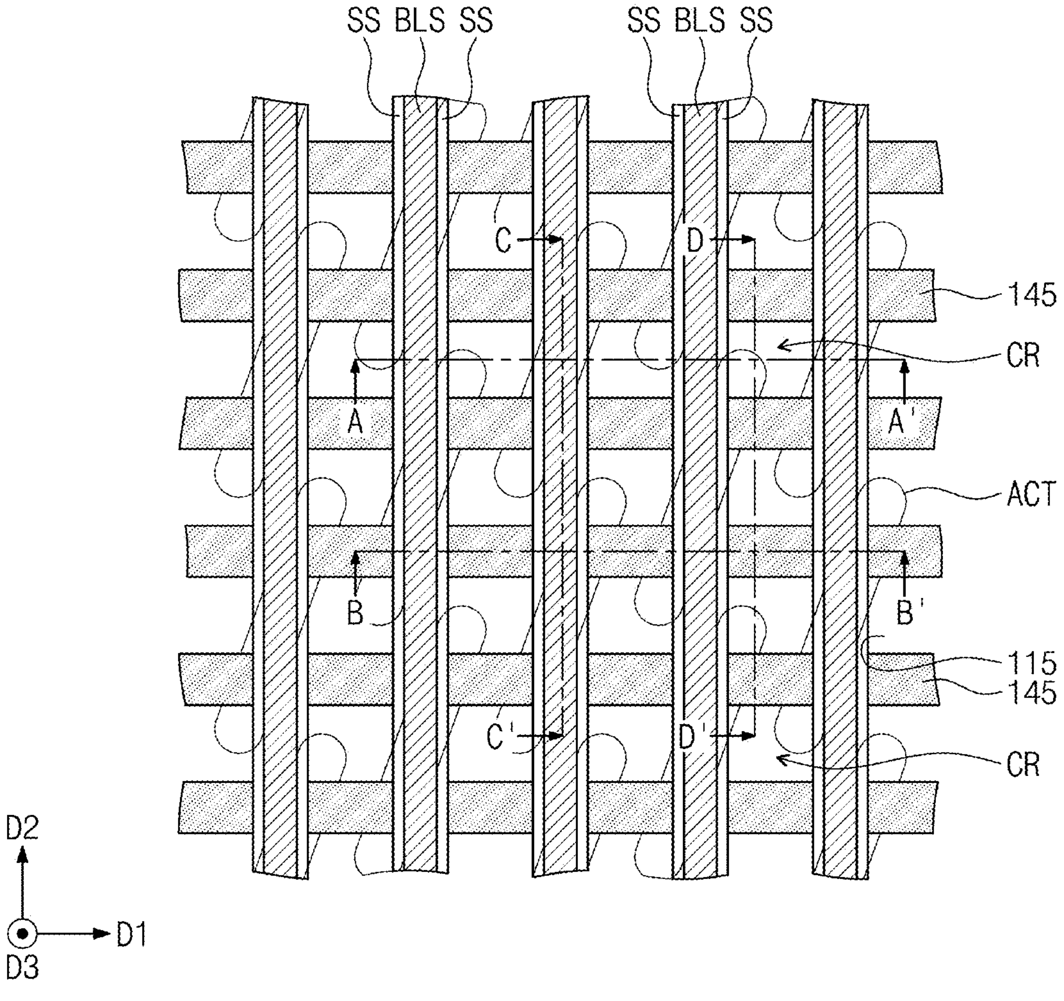
Figure 21A:
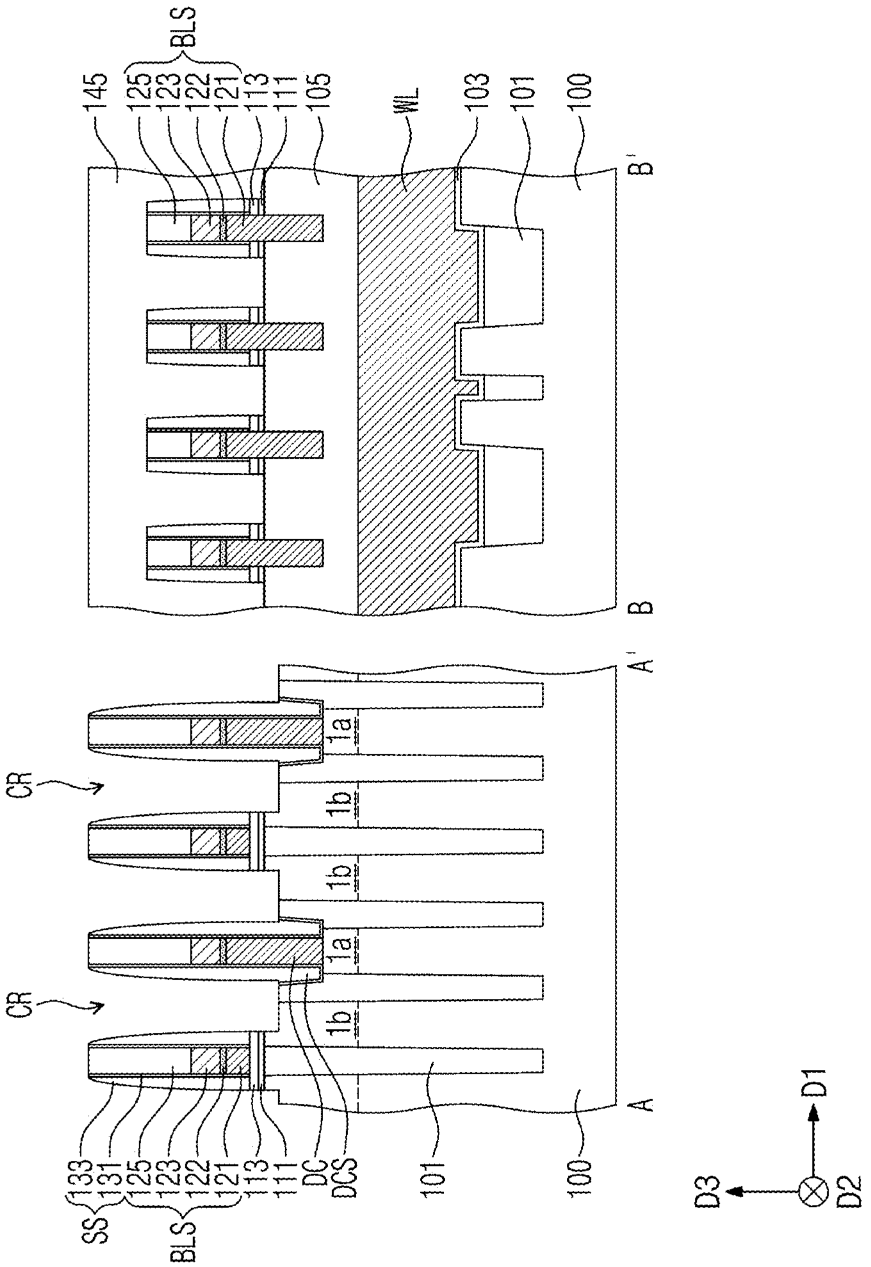
Figure 21B:
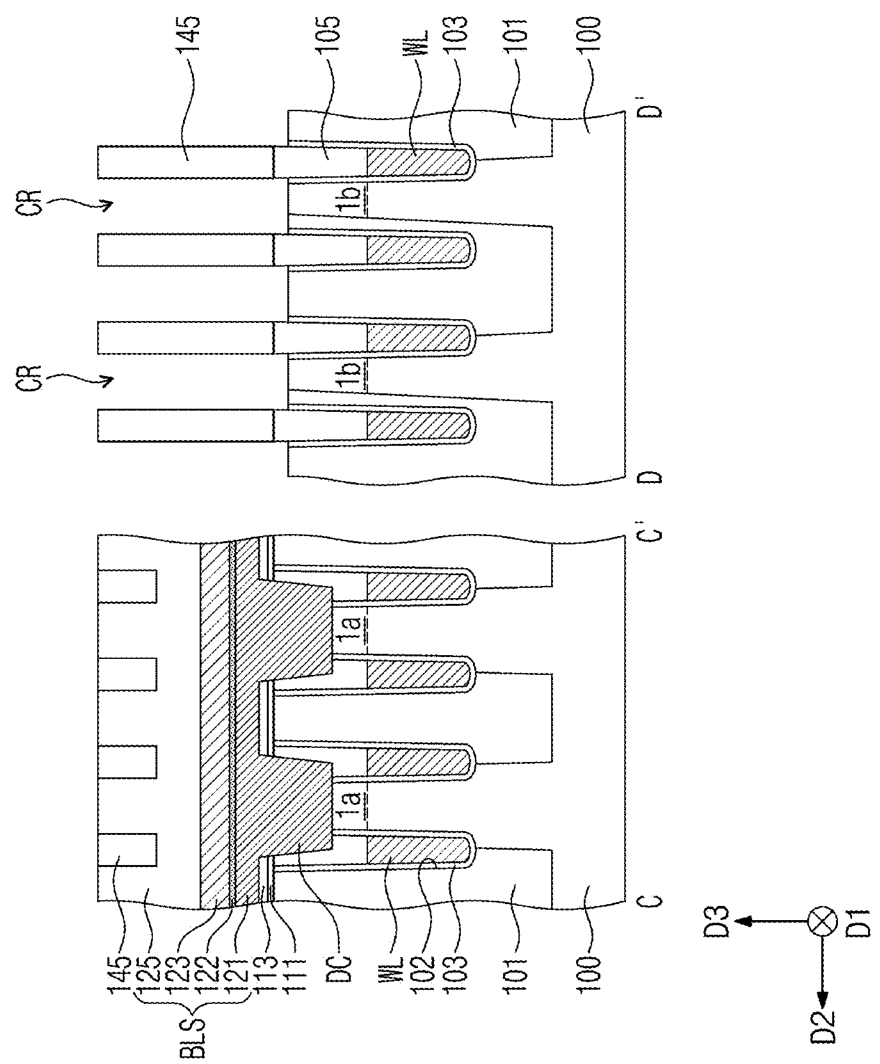

Referring to FIGS. 20, 21A, and 21B, the mold patterns 143 may be removed using an etch recipe that is chosen to have an etch selectivity with respect to the fence patterns 145, the bit line spacers SS, and the bit line structures BLS, after the formation of the fence patterns 145. Accordingly, a contact region CR may be defined by the bit line spacers SS and the fence patterns 145.

The mold patterns 143 may be removed by an isotropic etching process, and in an embodiment, the protection oxide layer 140 may be used as an etch stop layer in the process of etching the mold patterns 143. The protection oxide layer 140 may prevent the top surface of the semiconductor substrate (i.e., the top surface of the active pattern) from being exposed, when the mold patterns 143 are removed.

In the case where the mold patterns 143 are formed of undoped polysilicon, a wet cleaning process using ammonium hydroxide DIW mixture (ADM) may be performed. In the case where the mold patterns 143 are formed of an SOH material, they may be removed by an ashing process using $H_2$ or $O_2$.

An etching process may be performed to remove the protection oxide layer 140. For example, the etching process may include a plasma dry cleaning (PDC) process, but the inventive concept is not limited to this example. As a result of the removal of the protection oxide layer 140, a surface of the active portion ACT may be exposed.

The widths of the fence patterns 145 may be reduced by the etching processes of removing the mold patterns 143 and the protection oxide layer 140.

Figure 22:
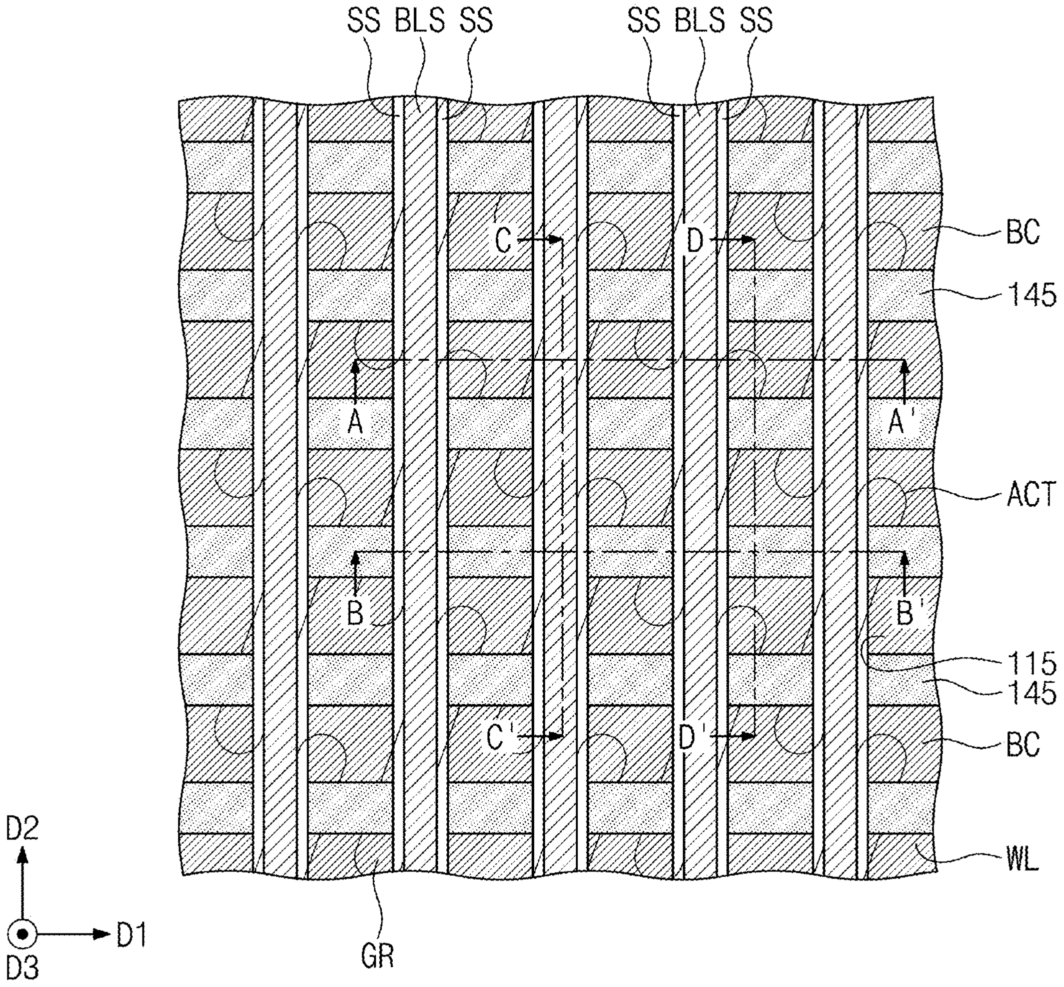
Figure 23A:
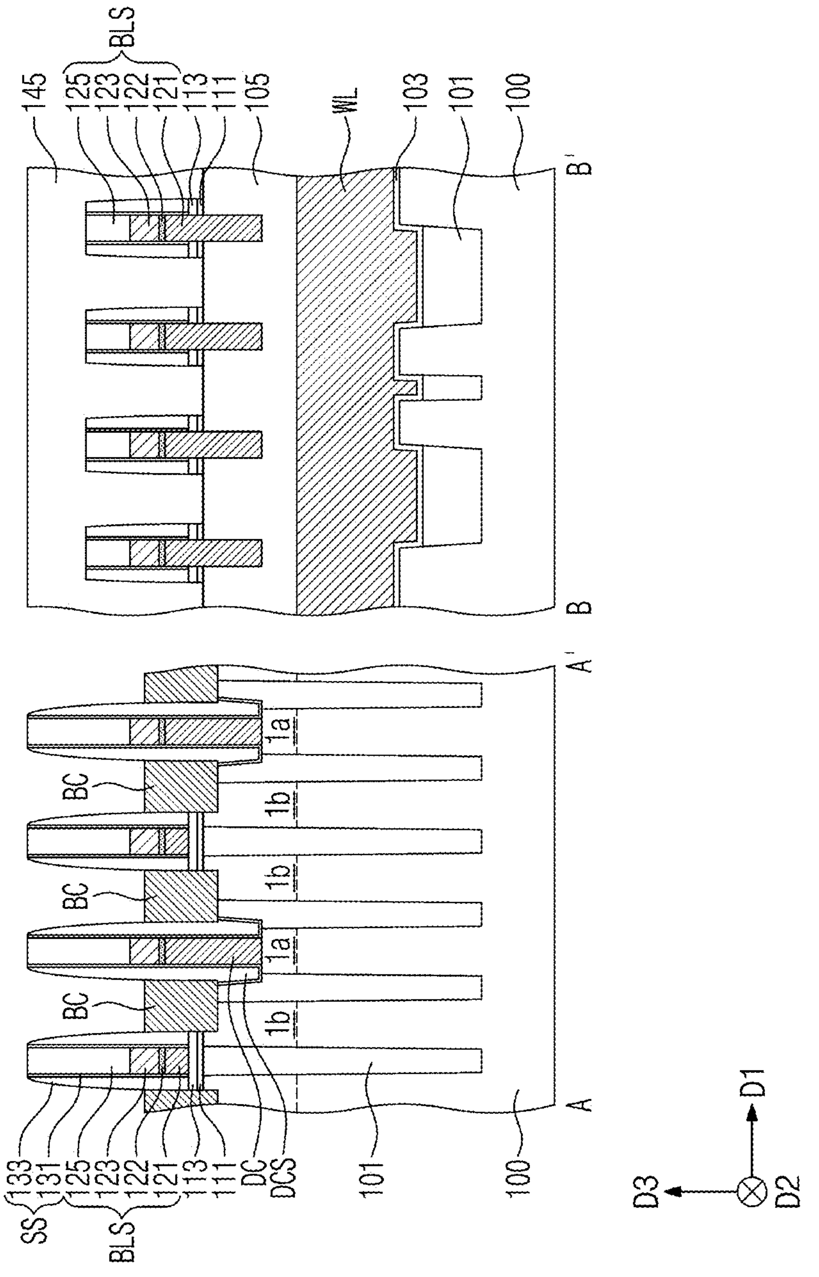
Figure 23B:
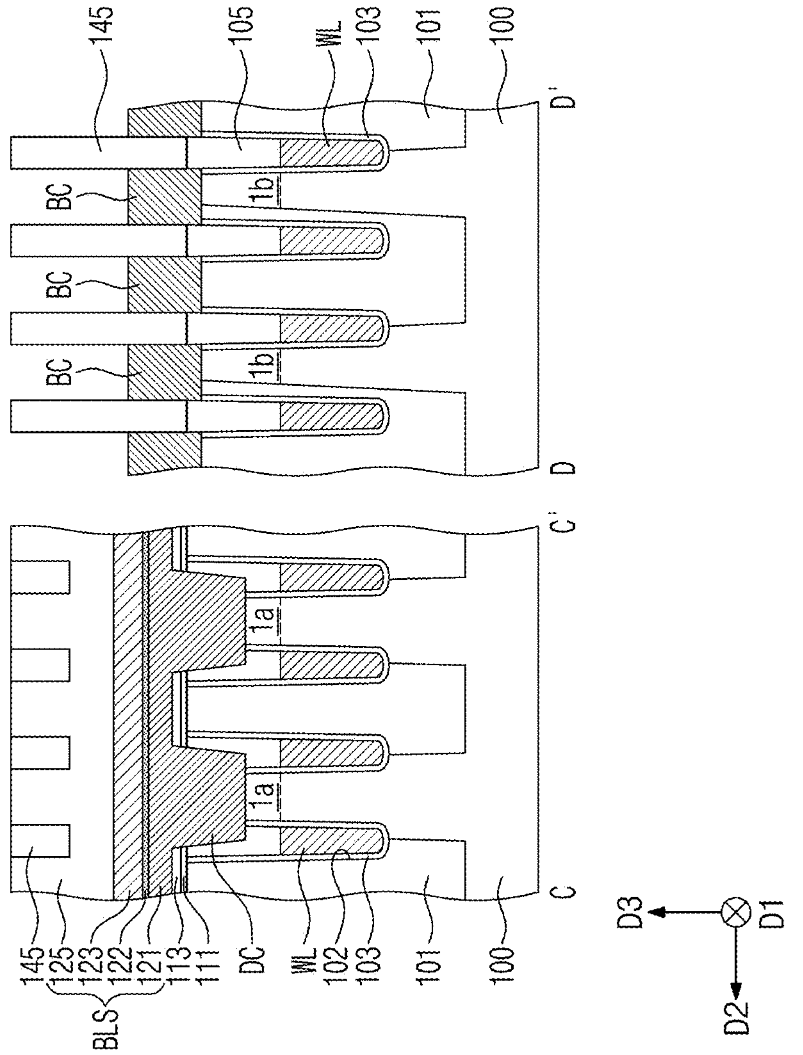

Referring to FIGS. 22, 23A, and 23B, the buried contact patterns BC may be formed to fill lower portions of the contact regions CR. In an embodiment, the buried contact patterns BC may have top surfaces that are located at a level lower than the top surfaces of the hard mask patterns 125 of the bit line structures BLS.

The formation of the buried contact patterns BC may include depositing a conductive layer to fill the contact region CR, planarizing the conductive layer to expose the top surfaces of the bit line structures BLS and the fence patterns 145, and recessing a top surface of the conductive layer. In this case, the buried contact patterns BC may be formed to expose upper portions of the bit line spacers SS in the contact regions CR.

The buried contact patterns BC may be formed of or include at least one of, for example, doped semiconductor materials (e.g., doped silicon), metallic materials (e.g., tungsten, aluminum, titanium, and/or tantalum), conductive metal nitrides (e.g., titanium nitride, tantalum nitride, and/or tungsten nitride), or metal-semiconductor compounds (e.g., metal silicide).

Figure 24:
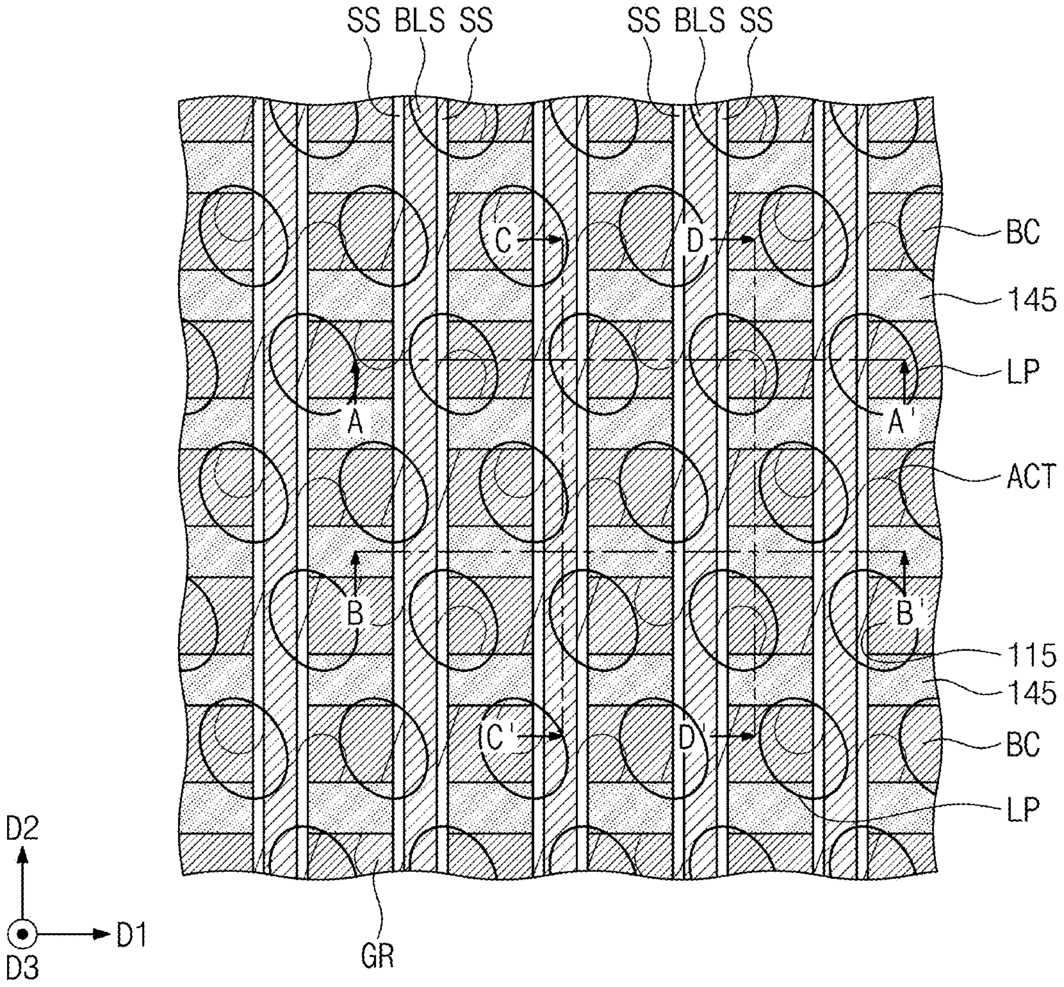
Figure 25A:
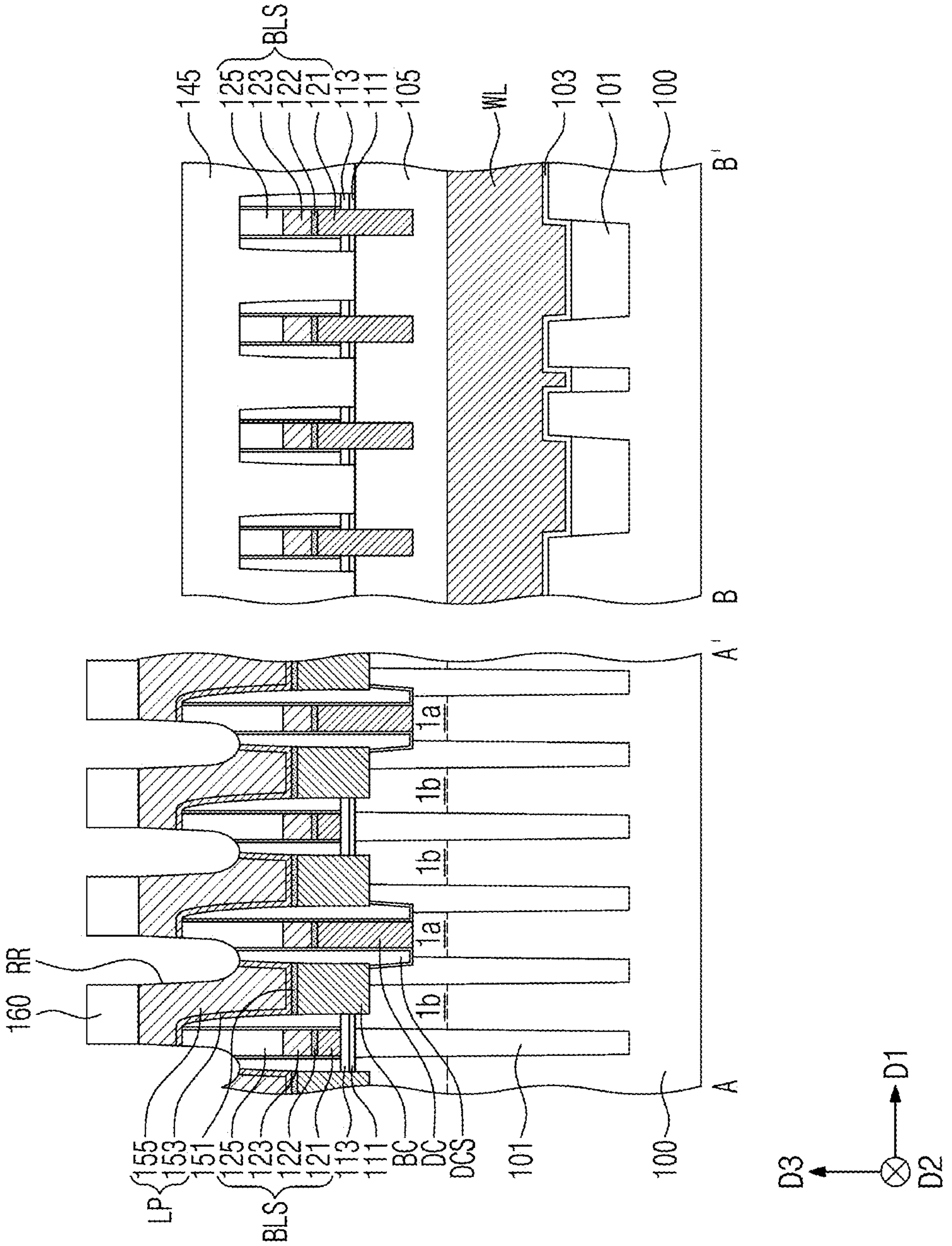
Figure 25B:
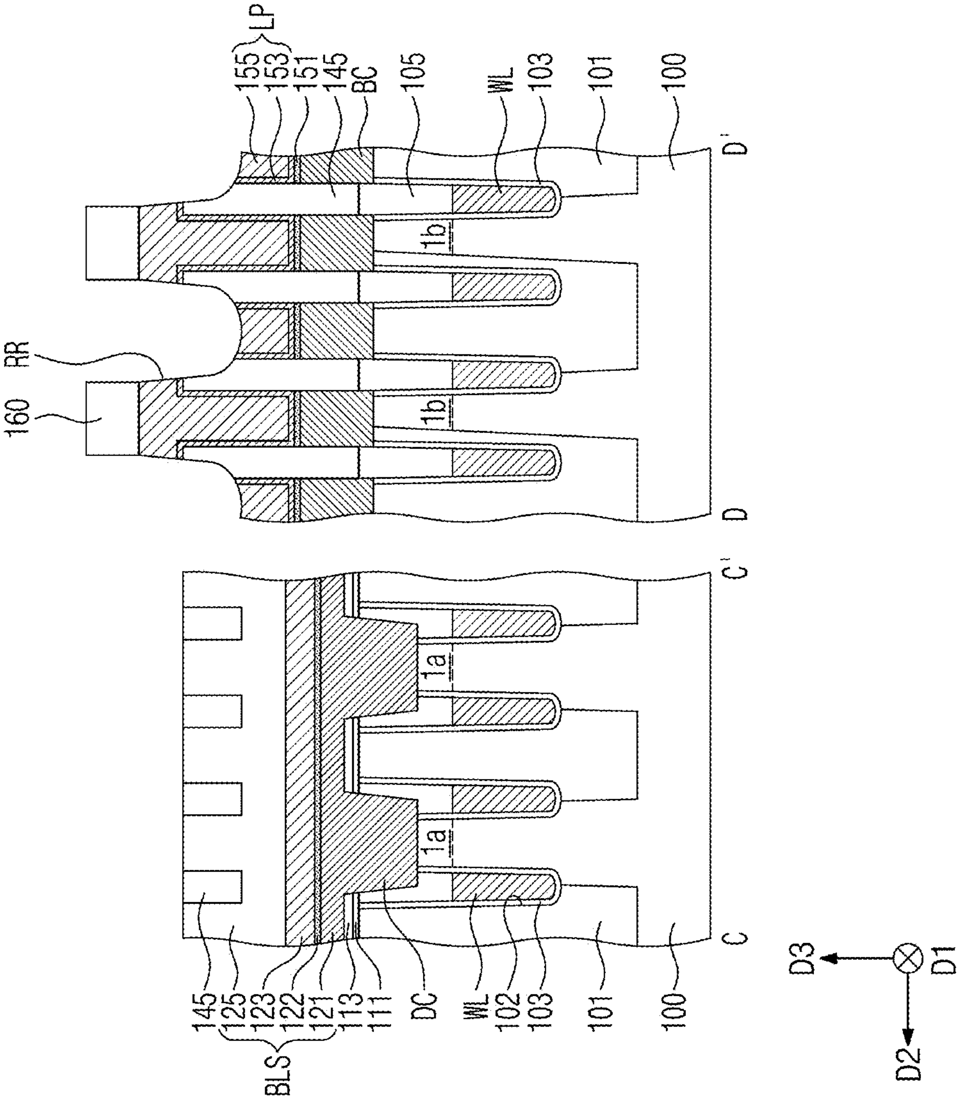

Referring to FIGS. 24, 25A, and 25B, contact silicide patterns 151 may be formed on the top surfaces of the buried contact patterns BC, respectively. The contact silicide patterns 151 may be formed through a reaction between a metal material and the top surfaces of the buried contact patterns BC. For example, the contact silicide patterns 151 may be formed of or include at least one of titanium silicide, cobalt silicide, nickel silicide, tungsten silicide, platinum silicide, or molybdenum silicide. Meanwhile, in an embodiment, the process of forming the contact silicide pattern 151 may be omitted.

Next, the landing pads LP may be formed to be connected to the buried contact patterns BC, respectively.

The formation of the landing pads LP may include conformally depositing a barrier metal layer 153 on the semiconductor substrate 100, forming a metal layer 155 on the barrier metal layer 153 to fill the contact region CR, forming mask patterns 160 on the metal layer 155, and sequentially etching the metal layer 155 and the barrier metal layer 153 using the mask patterns 160 as an etch mask to form a pad recess region RR. Here, the metal layer 155 may be formed to fully fill the contact region CR and to cover the bit line structures BLS.

The pad recess region RR may have a bottom surface, which is located at a level lower than the top surfaces of the bit line structures BLS, and this may make it possible to separate the landing pads LP from each other. In an embodiment, the hard mask pattern 125 and the bit line spacer SS may be partially etched during the formation of the pad recess region RR.

Each of the landing pads LP may include a lower portion, which is formed to fill a lower region of the contact region CR, and an upper portion, which extends to a region on the bit line structure BLS. When viewed in a plan view, the upper portions of the landing pads LP may have an elliptical shape, and in an embodiment, the landing pads LP may be formed to have the long axis that is inclined (e.g., diagonal) with respect to both of the first and second directions D1 and D2.

Thereafter, the mask patterns 160 may be removed, and the pad recess region RR may be filled with an insulating material. Next, data storage patterns DS may be formed on the landing pads LP as shown in FIGS. 1, 2A, and 2B.

According to an embodiment of the inventive concept, mold patterns may be used to form fence patterns between bit line structures, and thus, it may be possible to adjust widths of the fence patterns, after the formation of the fence patterns.

It may be possible to minimize a recess of a gate capping pattern, when a contact region is formed between the bit line structures to expose an active portion. Accordingly, it may be possible to prevent an undercut region from being formed under bit line spacers.

After the formation of the polysilicon-containing mold patterns, a residual mold pattern, which is left between adjacent ones of the mold patterns, may be oxidized and then may be removed, and thus, it may be possible to prevent an electric connection path from being formed between adjacent ones of buried contact patterns.

By using undoped polysilicon as the mold patterns, it may be possible to reduce a process temperature or energy for a thermal treatment process.

The buried contact pattern may have a bottom surface, which is substantially flat, and side surfaces, which are substantially perpendicular to the bottom surface, and in this case, it may be possible to increase a contact area between the buried contact pattern and the active portion.

While example embodiments of the inventive concept have been particularly shown and described, it will be understood by one of ordinary skill in the art that variations in form and detail may be made therein without departing from the spirit and scope of the attached claims.

What is claimed is:

1. A method of fabricating a semiconductor memory device, comprising:

forming a buffer insulating layer on a semiconductor substrate including active portions;

forming bit line structures on the buffer insulating layer;

forming bit line spacers on opposite side surfaces of each of the bit line structures;

forming gap regions extending lengthwise in a first direction by patterning the buffer insulating layer, each gap region formed between two adjacent ones of the bit line structures and exposing a section of each active portion of a set of active portions of the active portions;

forming a protection oxide layer to cover the exposed sections of each set of the active portions;

forming a mold layer to fill the gap regions, in which the protection oxide layer is formed;

forming mold patterns respectively in each of the gap regions, to be spaced apart from each other;

forming fence patterns in each of the gap regions and between the mold patterns;

removing the mold patterns to form contact regions;

removing the protection oxide layer to expose the sections of each set of the active portions; and forming buried contact patterns respectively in the contact regions to contact the exposed sections of each set of the active portions.

2. The method of claim 1, wherein the mold layer comprises undoped polysilicon.

3. The method of claim 2, further comprising:
before the forming of the fence patterns, oxidizing a surface of each mold pattern to form a buffer oxide layer; and
removing the buffer oxide layer on each mold pattern through an isotropic etching process.

4. The method of claim 1, wherein:
the buffer insulating layer comprises a first sub-buffer insulating layer covering a top surface of the semiconductor substrate and a second sub-buffer insulating layer on the first sub-buffer insulating layer, and
the second sub-buffer insulating layer comprises a material having an etch selectivity with respect to the first sub-buffer insulating layer.

5. The method of claim 1, wherein each of the buried contact patterns has a bottom surface, which is flat, and side surfaces, which are perpendicular to the bottom surface.

6. The method of claim 5, wherein:
a bottom surface and a side surface of the section of each of the active portions contact the bottom surface and one of the side surfaces of each of the buried contact patterns, respectively.

7. The method of claim 5, wherein the bottom surface of each of the buried contact patterns is located at a vertical level lower than a top surface of the semiconductor substrate.

8. The method of claim 1, further comprising:
before the forming of the buffer insulating layer, forming a device isolation layer in the semiconductor substrate to define the active portions, and
wherein the forming of the gap regions further comprises:
recessing a portion of the device isolation layer; and
recessing a portion of each active portion.

9. The method of claim 1, wherein each of the buried contact patterns is located at a level lower than a top surface of each of the bit line structures.

10. The method of claim 1, wherein a width of each of the buried contact patterns in a second direction crossing the first direction is equal to or smaller than a distance between adjacent ones of the bit line spacers between the two of adjacent ones of the bit line structures in the second direction.

11. The method of claim 1, further comprising:
isotropically etching side surfaces of each of the fence patterns to reduce respective widths of the fence patterns, after the removing of the mold patterns to form the contact regions.

12. The method of claim 1, wherein the fence patterns comprise silicon nitride.

13. The method of claim 1, further comprising:
forming landing pads, which are connected to the buried contact patterns, after the forming of the buried contact patterns,
wherein each of the landing pads comprises a lower portion, which is provided in a corresponding one of the contact regions and is connected to a corresponding one of the buried contact patterns, and an upper portion, which extends from the lower portion and is placed on one of the bit line structures.

14. A method of fabricating a semiconductor memory device, comprising:
forming word line structures in a semiconductor substrate including active portions, each word line structure crossing a first set of the active portions and extending lengthwise in a first direction;
forming a buffer insulating layer to cover a top surface of the semiconductor substrate and a top surfaces of each of the word line structures;
forming bit line structures on the buffer insulating layer, each bit line structure extending in a second direction crossing the first direction;
forming bit line spacers on opposite side surfaces of each of the bit line structures;
forming gap regions extending lengthwise in the second direction by patterning the buffer insulating layer, each gap region disposed between two adjacent ones of the bit line structures and exposing a section of each active portion of a second set of active portions of the active portions;
forming a protection oxide layer to cover the exposed sections of each second set of the active portions;
forming a mold layer to fill the gap regions;
patterning the mold layer using a mask pattern to form mold patterns spaced apart from each other in the second direction in each of the gap regions;
oxidizing a surface of each mold pattern to form a buffer oxide layer;
removing the buffer oxide layer on each mold pattern;
forming fence patterns between adjacent mold patterns of the mold patterns;
removing the mold patterns to form contact regions exposing the protection oxide layer, after the forming of the fence patterns;
removing the protection oxide layer to expose the sections of each second set of the active portions; and
forming buried contact patterns respectively contacting the exposed sections of each second set of the active portions.

15. The method of claim 14, wherein:
each of the word line structures comprises a word line, a gate capping pattern on the word line, and a gate insulating pattern between the semiconductor substrate and the word line, and
the forming of the gap regions comprises anisotropically etching a portions of each of the active portions to form the gap regions, such that a top surface of the portion of each of the active portions is located at a level lower than a top surface of the capping pattern of each of the word line structures.

16. The method of claim 15, wherein each of the buried contact patterns comprises a lower portion, which contacts a side surfaces of two of the gate capping patterns corresponding to two respective word line structures of the word line structures.

17. The method of claim 15, wherein a width of each of the fence patterns is smaller than a width of each gate capping pattern.

18. The method of claim 14, further comprising isotropically etching side surfaces of each of the fence patterns to reduce respective widths of the fence patterns, after removing the mold patterns to form the contact regions.

19. The method of claim 14, wherein each of the buried contact patterns has a bottom surface, which is flat and has a tetragonal shape.

20. The method of claim 14, wherein the mold layer comprises undoped polysilicon.

* * * * *